United States Patent
Inagaki

(10) Patent No.: US 10,362,214 B2
(45) Date of Patent: Jul. 23, 2019

(54) CONTROL APPARATUS, IMAGE CAPTURING APPARATUS, CONTROL METHOD, AND NON-TRANSITORY COMPUTER-READABLE STORAGE MEDIUM

(71) Applicant: CANON KABUSHIKI KAISHA, Tokyo (JP)

(72) Inventor: Yu Inagaki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/611,969

(22) Filed: Jun. 2, 2017

(65) Prior Publication Data
US 2017/0359500 A1 Dec. 14, 2017

(30) Foreign Application Priority Data
Jun. 10, 2016 (JP) .................. 2016-115998

(51) Int. Cl.
| | |
|---|---|
| H04N 5/232 | (2006.01) |
| G02B 7/28 | (2006.01) |
| G02B 15/16 | (2006.01) |
| H01L 27/146 | (2006.01) |
| G02B 7/34 | (2006.01) |

(52) U.S. Cl.
CPC ......... *H04N 5/23212* (2013.01); *G02B 7/282* (2013.01); *G02B 7/34* (2013.01); *G02B 15/16* (2013.01); *H01L 27/14627* (2013.01); *H04N 5/232122* (2018.08); *H04N 5/232123* (2018.08)

(58) Field of Classification Search
CPC .. G01R 29/26; H04B 10/07953; H04N 5/357; H04N 5/2173; H04N 5/3575; H04N 5/365; H04N 5/3653; H04N 1/58; H04N 1/409; G06K 9/40
See application file for complete search history.

(56) References Cited

U.S. PATENT DOCUMENTS

| | | | |
|---|---|---|---|
| 7,456,886 B2 | 11/2008 | Shinohara | |
| 2011/0164166 A1* | 7/2011 | Oikawa | ..................... G02B 7/36 348/340 |
| 2015/0002838 A1* | 1/2015 | Fukuda | .................. G02B 7/346 356/123 |

(Continued)

FOREIGN PATENT DOCUMENTS

| | | |
|---|---|---|
| EP | 1085751 A2 | 3/2001 |
| JP | 2001-083407 A | 3/2001 |

(Continued)

*Primary Examiner* — Sinh Tran
*Assistant Examiner* — Selam T Gebriel
(74) *Attorney, Agent, or Firm* — Venable LLP

(57) ABSTRACT

A control apparatus includes an acquirer (129*a*) that acquires a first signal and a second signal that correspond to output signals of a first photoelectric converter and a second photoelectric converter, respectively, the first and second photoelectric converters receiving light beams passing through different pupil regions of an image capturing optical system from each other, and a calculator (129*b*) that calculates a correlation value of the first signal and the second signal to calculate a defocus amount based on the correlation value, and the calculator corrects the correlation value based on a light receiving amount of at least one of the first photoelectric converter and the second photoelectric converter.

16 Claims, 18 Drawing Sheets

(56) References Cited

U.S. PATENT DOCUMENTS

| | | | | |
|---|---|---|---|---|
| 2015/0244926 A1* | 8/2015 | Inoue | ................. | G02B 7/34 |
| | | | | 348/350 |
| 2015/0296129 A1* | 10/2015 | Ishikawa | ............ | H04N 5/23212 |
| | | | | 348/349 |
| 2016/0191787 A1 | 6/2016 | Inagaki | | |

FOREIGN PATENT DOCUMENTS

| | | | |
|---|---|---|---|
| JP | 2004-134867 A | 4/2004 | |
| JP | 2011-044813 A | 3/2011 | |

* cited by examiner

CONTROL APPARATUS, IMAGE CAPTURING APPARATUS, CONTROL METHOD, AND NON-TRANSITORY COMPUTER-READABLE STORAGE MEDIUM

BACKGROUND OF THE INVENTION

Field of the Invention

The present invention relates to an image capturing apparatus which performs automatic focus detection.

Description of the Related Art

Previously, as a focus detection method of an image capturing apparatus, various methods such as a phase difference detection method using a focus detection element and a contrast detection method using a contrast component of an image acquired by an image sensor have been proposed. Furthermore, by adopting a configuration where pixels of the image sensor receive light beams passing through different pupils of an imaging lens, a technology that performs focus detection by the phase difference detection method simultaneously with capturing an image has been known.

Japanese Patent Laid-open No. 2001-083407 discloses a configuration where light collected by one microlens corresponding to one pixel is photoelectrically converted by divided photodiodes (PDs) so that the respective PDs can receive light passing through different pupils of the imaging lens. In this configuration, outputs of the two PDs are compared to be able to perform the focus detection.

Japanese Patent Laid-open No. 2011-044813 discloses an image capturing apparatus which stores two captured images having different uniform luminances from each other in a memory to read out the two images in calculating a correction value to calculate a gain correction value and an offset correction value. By using the gain correction value and the offset correction value, a fixed pattern noise for each pixel can be removed.

However, Japanese Patent Laid-open No. 2001-083407 does not disclose focus detection considering the fixed pattern noise for each pixel. A correlation calculation result in the focus detection varies due to the fixed pattern noise for each pixel as an in-phase noise, and accordingly the focus detection cannot be performed with high accuracy. In Japanese Patent Laid-open No. 2011-044813, the correction value related to an entire surface of the image sensor is recorded, and accordingly it is necessary to prepare a memory capacity for the entire surface of the image sensor. Furthermore, it takes a time for processing because the correction is to be performed on the entire surface of the image sensor.

SUMMARY OF THE INVENTION

The present invention provides a control apparatus, an image capturing apparatus, a control method, and a non-transitory computer-readable storage medium which are capable of performing high-speed and high-accuracy focus detection.

A control apparatus as one aspect of the present invention includes an acquirer configured to acquire a first signal and a second signal that correspond to output signals of a first photoelectric converter and a second photoelectric converter, respectively, the first and second photoelectric converters receiving light beams passing through different pupil regions of an image capturing optical system from each other, and a calculator configured to calculate a correlation value of the first signal and the second signal to calculate a defocus amount based on the correlation value, and the calculator is configured to correct the correlation value based on a light receiving amount of at least one of the first photoelectric converter and the second photoelectric converter.

An image capturing apparatus as another aspect of the present invention includes an image sensor including a first photoelectric converter and a second photoelectric converter that receive light beams passing through different pupil regions of an image capturing optical system from each other, and the control apparatus.

A control method as another aspect of the present invention includes the steps of acquiring a first signal and a second signal that correspond to output signals of a first photoelectric converter and a second photoelectric converter, respectively, the first and second photoelectric converters receiving light beams passing through different pupil regions of an image capturing optical system from each other, and calculating a correlation value of the first signal and the second signal to calculate a defocus amount based on the correlation value, and the step of calculating the defocus amount includes the steps of correcting the correlation value based on a light receiving amount of at least one of the first photoelectric converter and the second photoelectric converter, and calculating the defocus amount based on the corrected correlation value.

A non-transitory computer-readable storage medium as another aspect of the present invention stores a program which causes a computer to execute the control method.

Further features of the present invention will become apparent from the following description of exemplary embodiments with reference to the attached drawings.

DESCRIPTION OF THE EMBODIMENTS

Exemplary embodiments of the present invention will be described below with reference to the accompanied drawings.

Embodiment 1

(Configuration of Image Capturing Apparatus)

Figure 1:
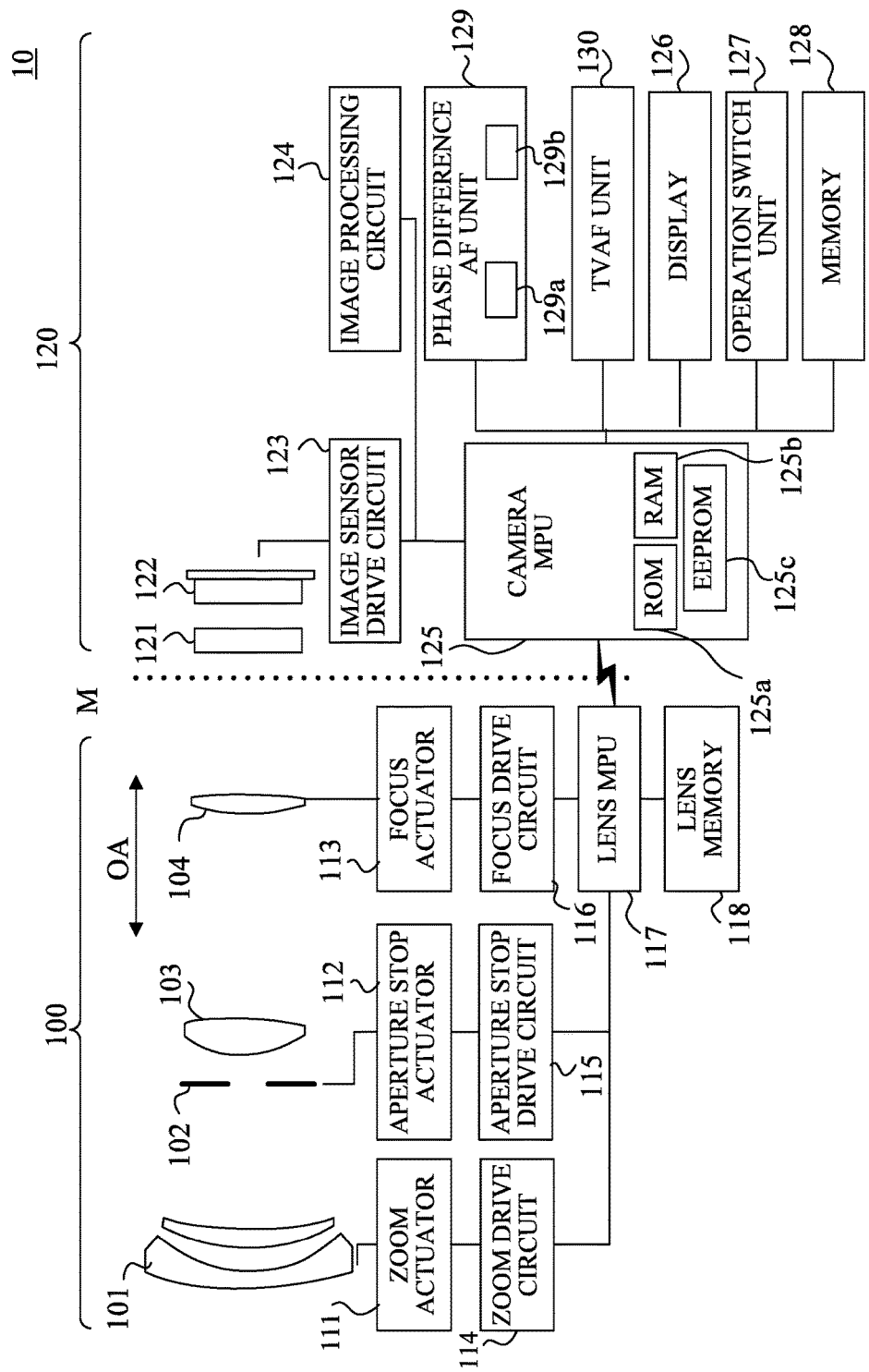
FIG. 1 is a block diagram of an image capturing apparatus in each embodiment.

First, referring to FIG. 1, a configuration of an image capturing apparatus in Embodiment 1 of the present invention will be described. FIG. 1 is a block diagram of an image capturing apparatus 10 (digital single-lens reflex camera with interchangeable lenses) in this embodiment. The image capturing apparatus 10 is a camera system including a lens unit (interchangeable lens) 100 and a camera body 120. The lens unit 100 is removably attached to the camera body 120 via a mount M indicated by a dotted line in FIG. 1. However, this embodiment is not limited thereto, and is can be applied also to an image capturing apparatus (digital camera) including a lens unit (image capturing optical system) and a camera body integrated with each other. This embodiment is not limited to the digital camera, and it can be applied also to other image capturing apparatuses such as a video camera.

The lens unit 100 includes a first lens unit 101, an aperture stop 102, a second lens unit 103, and a focus lens unit (hereinafter, referred to simply as a "focus lens") 104 as an optical system, and a drive/control system. Thus, the lens unit 100 is an imaging lens (image capturing optical system) that includes the focus lens 104 and forms an object image.

The first lens unit 101 is arranged at the end (front end) of the lens unit 100, and it is held to be movable forward and backward in an optical axis direction OA. The aperture stop 102 adjusts its opening diameter to adjust a light amount at the time of capturing an image, and it serves as a shutter for adjusting an exposure time at the time of capturing a still image. The aperture stop 102 and the second lens unit 103 are integrally movable in the optical axis direction OA, and they achieve a zoom function in conjunction with a movement of the first lens unit 101 forward and backward. The focus lens 104 is movable in the optical axis direction OA, and it changes an object distance (in-focus distance) where the lens unit 100 focuses depending on its position. By controlling the position of the focus lens 104 in the optical axis direction OA, it is possible to perform focus adjustment (focus control) for adjusting the in-focus distance of the lens unit 100.

The drive/control system includes a zoom actuator 111, an aperture stop actuator 112, a focus actuator 113, a zoom drive circuit 114, an aperture stop drive circuit 115, a focus drive circuit 116, a lens MPU 117, and a lens memory 118. The zoom drive circuit 114 drives the first lens unit 101 or the third lens unit 103 in the optical axis direction OA by using the zoom actuator 111 to control an angle of view of the optical system in the lens unit 100 (i.e., perform a zoom operation). The aperture stop drive circuit 115 drives the aperture stop 102 by using the aperture stop actuator 112 to control the opening diameter or the opening/closing operation of the aperture stop 102. The focus drive circuit 116 drives the focus lens 104 in the optical axis direction OA by using the focus actuator 113 to control the in-focus distance of the optical system in the lens unit 100 (i.e., perform the focus control). Furthermore, the focus drive circuit 116 serves as a position detector that detects a current position of the focus lens 104 (lens position) by using the focus actuator 113.

The lens MPU (processor) 117 performs all calculations and controls related to the lens unit 100, and it controls the zoom drive circuit 114, the aperture stop drive circuit 115, and the focus drive circuit 116. Furthermore, the lens MPU 117 is coupled to a camera MPU 125 via the mount M, and it communicates commands or data. For example, the lens MPU 117 detects the position of the focus lens 104, and it sends lens position information in response to a request from the camera MPU 125. The lens position information includes information such as a position of the focus lens 104 in the optical axis direction OA, a position or a diameter in the optical axis direction OA of an exit pupil in a state where the optical system does not move, and a position or a diameter in the optical axis direction OA of a lens frame that limits light beams of the exit pupil. In addition, the lens MPU 117 controls the zoom drive circuit 114, the aperture stop circuit 115, and the focus drive circuit 116 in response to the request from the camera MPU 125. The lens memory 118 stores optical information required for autofocusing (AF control). For example, the camera MPU 125 executes a program stored in a built-in non-volatile memory or the lens memory 118 to control the operation of the lens unit 100.

The camera body 120 includes an optical low-pass filter 121, an image sensor 122, and a drive/control system. The optical low-pass filter 121 and the image sensor 122 serve as an image capturing unit (image capturing device) that photoelectrically converts an object image (optical image) formed via the lens unit 100 to output image data. In this embodiment, the image sensor 122 photoelectrically converts the object image formed via the image capturing optical system to output an imaging signal and a focus detection signal as image data. In this embodiment, the first lens unit 101, the aperture stop 102, the second lens unit 103, the focus lens 104, and the optical low-pass filter 121 constitute the image capturing optical system.

The optical low-pass filter 121 reduces a false color or a moire of a captured image. The image sensor 122 includes a CMOS image sensor and its peripheral circuit, and m pixels in a horizontal direction and n pixels in a vertical direction (m and n are integers greater than or equal to 2) are arranged. The image sensor 122 of this embodiment has a pupil dividing function, and it includes pupil dividing pixels that are capable of focus detection by a phase difference detection method (i.e., phase difference AF) using the image data (image signals). An image processing circuit 124 generates data used for the phase difference AF and image data used for display, record, and a contrast AF (TVAF) based on the image data output from the image sensor 122.

The drive/control system includes an image sensor drive circuit 123, the image processing circuit 124, the camera MPU 125, a display 126, an operation switch unit (operation SW) 127, a memory 128, a phase difference AF unit (imaging-plane phase difference focus detector) 129, and a TVAF unit (TVAF focus detector) 130. The image sensor drive circuit 123 controls the operation of the image sensor 122, and it performs analog-to-digital (A/D) conversion of the image signal (image data) output from the image sensor 122 to be sent to the camera MPU 125. The image processing circuit 124 performs typical image processing performed in the digital camera, such as gamma conversion, white balance adjustment processing, color interpolation processing, and compression encoding processing performed, on the image signal output from the image sensor 122. Furthermore, the image processing circuit 124 generates a signal used for the phase difference AF.

The camera MPU 125 (processor or control apparatus) performs all calculations and controls related to the camera body 120. In other words, the camera MPU 125 controls the image sensor drive circuit 123, the image processing circuit 124, the display 126, the operation switch unit 127, the memory 128, the phase difference AF unit 129, and the TVAF unit 130. The camera MPU 125 is coupled to the lens MPU 117 via a signal line of the mount M, and it communicates commands or data with the lens MPU 117. The camera MPU 125 issues requests to the lens MPU 117 for acquiring a lens position and for a lens drive with a predetermined drive amount to the lens MPU 117, and it issues a request to the lens MPU 117 for acquiring optical information specific to the lens unit 100.

The camera MPU 125 is provided with a ROM 125a that stores a program controlling the operation of the camera body 120, a RAM (camera memory) 125b that stores variables, and an EEPROM 125c that stores various parameters as built-in memories. Furthermore, the camera MPU 125 performs focus detection processing based on the program stored in the ROM 125a. In the focus detection processing, known correlation calculation processing is performed by using pairs of image signals which are obtained by photoelectric conversion of the optical image formed via light beams passing through different pupil regions (partial pupil regions) of the image capturing optical system.

The display 126 includes an LCD or the like, and it displays information related to an image capturing mode of the image capturing apparatus 10, a preview image before photography, an image after the photography for confirmation, an image for displaying a focus state during the focus detection, and the like. The operation switch unit 127 includes a power switch, a release (image capturing trigger) switch, a zoom operation switch, image capturing mode selecting switch, and the like. The memory (recording device) 128 is a removable flash memory, and it records the captured image.

The phase difference AF unit 129 performs the focus detection processing by the phase difference detection method based on the image signals of focus detection image data obtained from the image sensor 122 and the image processing circuit 124. More specifically, the image processing circuit 124 generates, as focus detection data, a pair of image data formed by light beams passing through a pair of pupil regions of the image capturing optical system, and the phase difference AF unit 129 detects a defocus amount based on a shift amount of the pair of image data. Thus, the phase difference AF unit 129 of this embodiment performs the phase difference AF based on an output of the image sensor 122 (i.e., imaging-plane phase difference AF) without using a dedicated AF sensor. In this embodiment, the phase difference AF unit 129 includes an acquirer (acquisition unit) 129a and a calculator (calculation unit) 129b. Each of operations of these units will be described below. At least a part of functions of the phase difference AF unit 129 (part of the acquirer 129a or the calculator 129b) may be provided in the camera MPU 125. Details of the operation of the phase difference AF unit 129 will be described below.

The TVAF unit 130 performs focus detection processing by a contrast detection method based on a TVAF evaluation value (contrast information of image data) generated by the image processing circuit 124. In the focus detection processing by the contrast detection method, a focus lens position where the evaluation value (focus evaluation value) is peaked while moving the focus lens 104 is detected as an in-focus position.

Thus, the image capturing apparatus 10 of this embodiment can perform the imaging-plane phase difference AF combined with the TVAF, and it can use them selectively or in combination depending on a situation. The phase difference AF unit 129 and the TVAF unit 130 serve as a focus controller that controls the position of the focus lens 104 by using each of focus detection results.

Figure 2A:
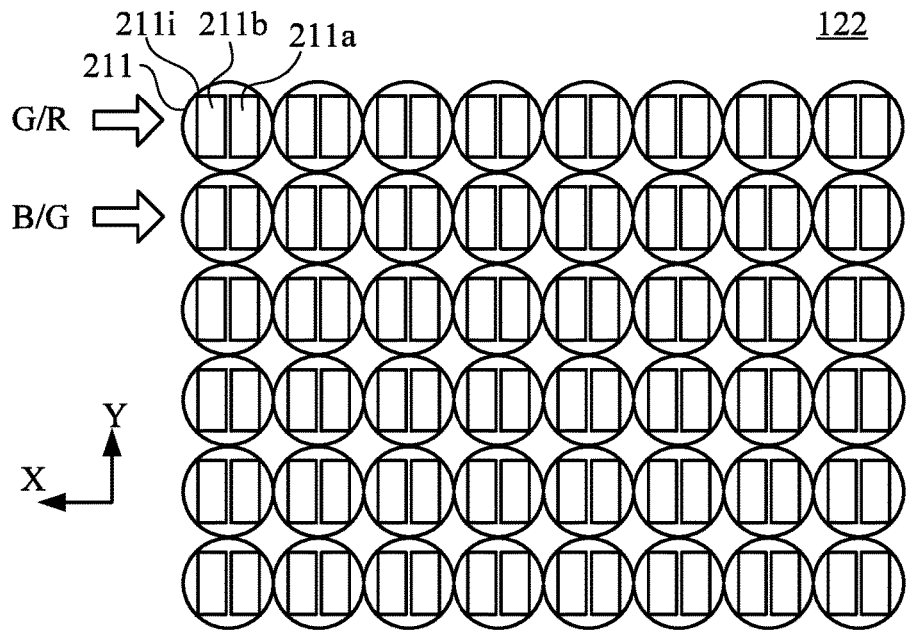
FIGS. 2A and 2B are pixel array diagrams of an image sensor and a configuration diagram of a readout circuit in each embodiment, respectively.

Next, referring to FIGS. 2A and 2B, the operation of the phase difference AF unit 129 will be described. FIG. 2A is a pixel array diagram of the image sensor 122 in this embodiment, and it illustrates a situation where a range of six rows in a vertical direction (Y direction) and eight columns in a horizontal direction (X direction) of a two-dimensional CMOS area sensor is viewed from the lens unit 100. The image sensor 122 is provided with color filters in a Bayer array. With respect to pixels at odd rows, green (G) and red (R) color filters are alternately arranged in order from the left, and with respect to pixels at even rows, blue (B) and green (G) color filters are alternately arranged in order from the left. With respect to a pixel 211, a circle 211i indicates an on-chip microlens, and a plurality of rectangles arranged inside the on-chip microlens 211i indicate photoelectric converters 211a and 211b (first photoelectric converter and second photoelectric converter).

With respect to the image sensor 211 of this embodiment, each pixel 211 is divided into two parts as photoelectric converters 211a and 211b in the X direction. Each of a photoelectric conversion signal of one of the divided photoelectric converters (i.e., one of the photoelectric converters 211a and 211b) and a sum of the two photoelectric conversion signals can be independently read out. The camera MPU 125 subtracts the photoelectric conversion signal of one of the divided photoelectric converters (for example, photoelectric converter 211a) from the sum of the two photoelectric conversion signals. Thus, a signal corresponding to the photoelectric conversion signal obtained from the other photoelectric converter (for example, photoelectric converter 211b) can be obtained. A signal acquirer that acquires the signal of the first photoelectric converter and the signal of the second photoelectric converter while performing a series of the operation is constituted by the photoelectric converters and the camera MPU 125. The photoelectric conversion signals of the divided photoelectric converters are used as data for the phase difference AF, and they can also be used for generation of parallax images to create a 3D (three-dimensional) image. The sum of the two photoelectric converters can be used as common captured image data.

Here, pixel signals used for performing the phase difference AF will be described. As described below, in this embodiment, a pupil of an emitted light beam of the image capturing optical system is divided by using the microlens 211i and the divided photoelectric converters 211a and 211b illustrated in FIGS. 2A and 2B. The photoelectric converters 211a and 211b constitute pupil dividing pixels in this embodiment. With respect to a plurality of pixels 211 within a predetermined range which are arranged on the same pixel row, outputs of the photoelectric converters 211a are organized as an image A for AF. Similarly, outputs of the photoelectric converters 211b are organized as an image B for AF. As outputs of the photoelectric converters 211a and 211b, a pseudo luminance (Y) signal that is calculated by adding outputs of green, red, blue, and green (in the Bayer array) included in a unit array of the color filters is used. Alternatively, the image A and the image B for AF may be organized for each of colors of red, blue, and green. By detecting a relative image shirt amount of the image A and the image B for AF generated as described above, a focus shift amount in a predetermined area, that is, a defocus amount can be detected (calculated).

In this embodiment, while one of the image A and the image B for AF is not output from the image sensor 122, as described above, the sum of the outputs of the image A and the image B is output, and accordingly the other signal can be obtained based on the one of the outputs and the output of the sum to perform focus detection. The image sensor 122 of this embodiment can be manufactured by using a technology, for example, disclosed in Japanese Patent Laid-open No. 2004-134867, and therefore detail descriptions regarding its structure are omitted.

In this embodiment, the output of the one of the photoelectric converters and the sum of all the photoelectric converters are read from the image sensor 122. For example, when the output of the photoelectric converter 211a and the sum of the outputs of the photoelectric converters 211a and 211b are read out, the output of the photoelectric converter 211b is acquired by subtracting the output of the photoelectric converter 211a from the sum of the outputs of the photoelectric converters 211a and 211b. As a result, both the image A and the image B for AF can be obtained to achieve the phase difference AF. A basic structure of the image sensor 122 in this embodiment is disclosed for example in Japanese Patent Laid-open No. 2004-134867, and therefore detail descriptions thereof are omitted.

Figure 2B:
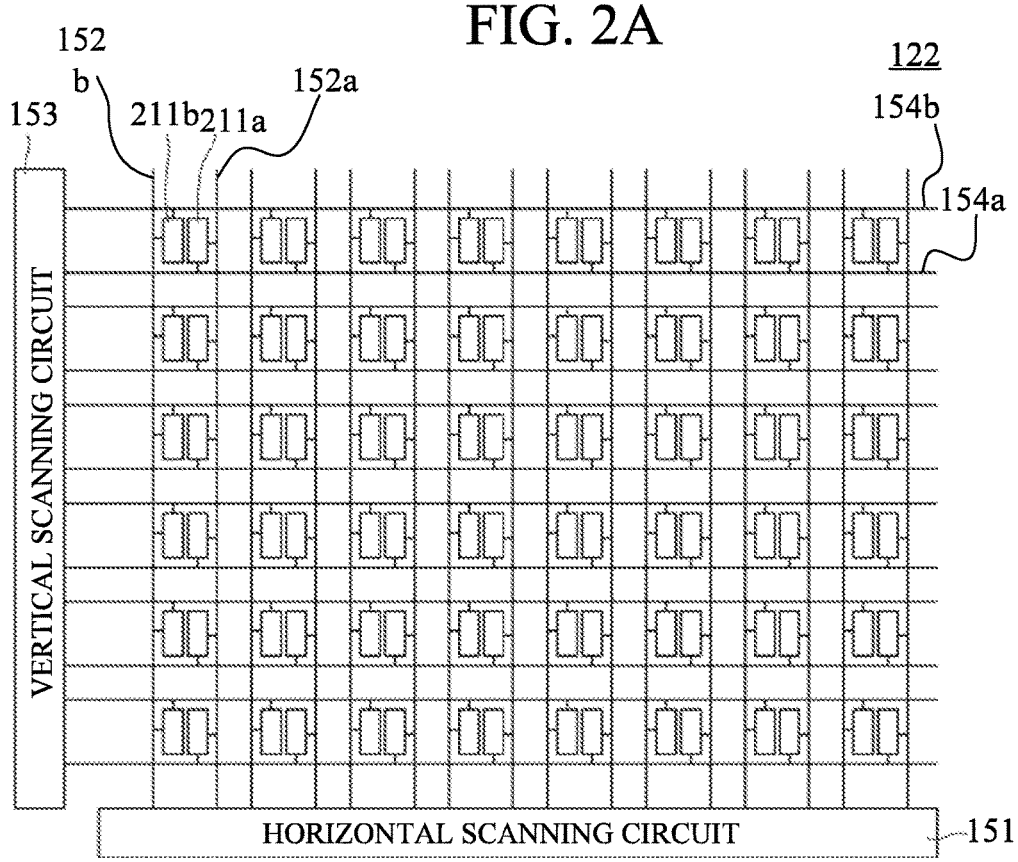

FIG. 2B is a configuration diagram of a readout circuit of the image sensor 122 in this embodiment. In FIG. 2B, reference numeral 151 denotes a horizontal scanning circuit, and reference numeral 153 denotes a vertical scanning circuit. At a boundary of each pixel, horizontal scanning lines 152a and 152b and vertical scanning lines 154a and 154b are arranged, and signals from the photoelectric converters 211a and 211b are read out to an external device via these scanning lines.

The image sensor 122 of this embodiment has the following two types of readout mode (first readout mode and second readout mode) in addition to a readout method in the pixels described above. The first readout mode is called a full pixel readout mode, which is a mode for capturing a high-definition still image. In the first readout mode, signals from all pixels are read out. On the other hand, the second readout mode is called decimating readout mode, which is a mode only for recording a moving image or displaying a preview image. In the second readout mode, the number of required pixels is smaller than that of all pixels, and accordingly only decimated pixels of all pixels with a predetermined ratio both in the X and Y directions are read out. In addition, when it is necessary to be read at high speed, similarly, the decimating readout mode is used. When the decimating is performed in the X direction, signals are added to improve S/N. On the other hand, when the decimating is performed in the Y direction, the output of a signal at a decimated row is ignored. Typically, the phase difference AF or the TVAF is performed in the second readout mode.

(Focus Adjustment)

Next, referring to FIGS. 3A, 3B, 4A, and 4B, the focus detection by the phase difference detection method will be described. FIGS. 3A, 3B, 4A, and 4B are explanatory diagrams of the focus detection by the phase difference detection method.

Figure 3A:
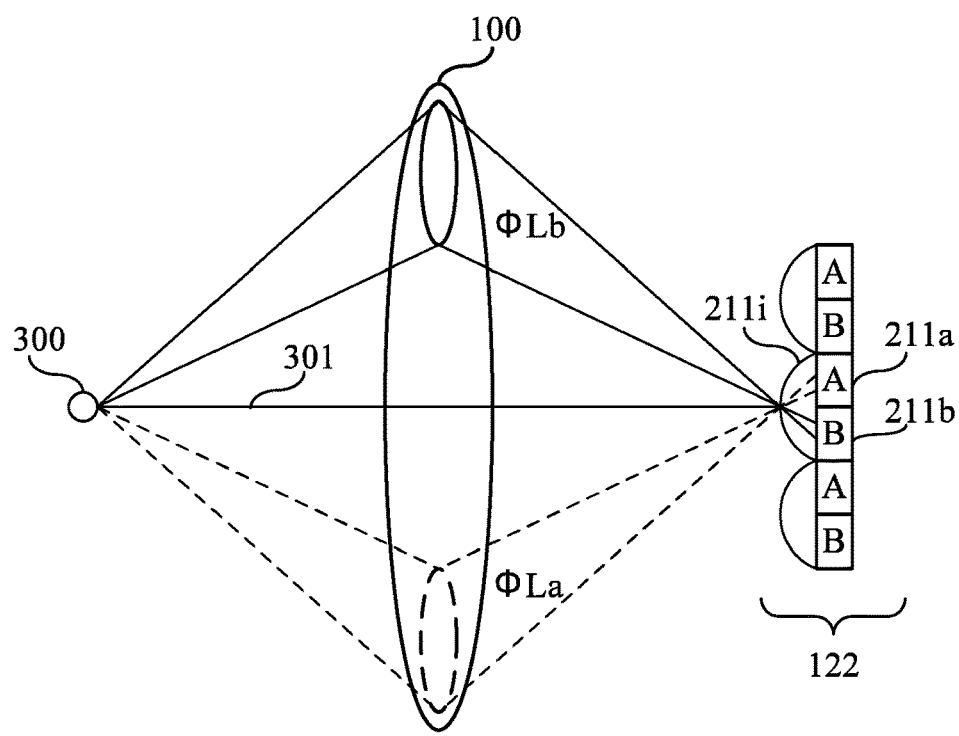
FIGS. 3A and 3B are explanatory diagrams of focus detection by a phase difference detection method in each embodiment.
Figure 3B:
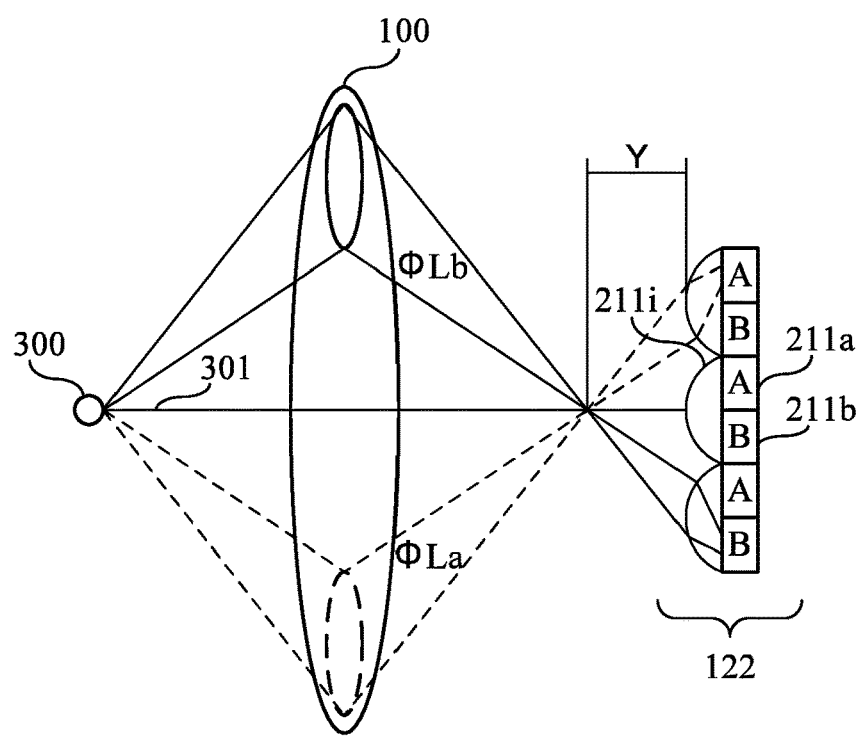

First, referring to FIGS. 3A and 3B, the relationship between a focus and a phase difference in the image sensor 122 will be described. FIG. 3A illustrates a position relation of the lens unit 100, an object 300, an optical axis 301, and the image sensor 122, and light beams when the focus (focus position) is in an in-focus state. FIG. 3B illustrates the position relation and the light beams when the focus is not in the in-focus state (out-of-focus state). The image sensor 122 of FIGS. 3A and 3B is in a state where the image sensor 122 illustrated in FIG. 2A is viewed in a cross-sectional direction.

Each pixel of the image sensor 122 is provided with one microlens 211i. As described above, the photodiodes 211a and 211b receive the light beams passing through the single microlens 211i. Different images with a phase difference from each other are incident on the photodiodes 211a and 211b by the configuration described below. In this embodiment, the photodiodes 211a and 211b are referred to as first and second photoelectric converters, respectively. In FIGS. 3A and 3B, the first and second photoelectric converters are indicated by "A" and "B", respectively.

As described above, the image sensor 122 includes the first photoelectric converter and the second photoelectric converter for the single microlens 211i, and the plurality of microlenses 211i are arrayed in two dimensions. While the two photodiodes 211a and 211b are arranged to share one of the microlenses 211i in this embodiment, it is not limited thereto. For example, four diodes (two photodiodes in a vertical direction and two photodiodes in a horizontal direction) may be arranged to share one microlens. In other words, a plurality of photodiodes may be arranged in at least one of the vertical direction and the horizontal direction to share one microlens.

As illustrated in FIG. 1, the lens unit 100 is an equivalent imaging lens when the first lens unit 101, the second lens unit 103, and the focus lens 104 are collectively considered as one lens. Light beams emitted from the object 300 pass through respective regions of the lens unit 100 centered around the optical axis 301 to be imaged on the image sensor 122. In this embodiment, the position of an exit pupil and the center position of the imaging lens are identical to each other.

According to this configuration, a case where the image capturing optical system is viewed from the first photoelectric converter and it is viewed from the second photoelectric converter is equivalent to a case where a pupil of the image capturing optical system is symmetrically divided. In other words, the configuration is so-called a pupil-divided configuration where the light beam from the image capturing optical system is divided into two light beams. The divided light beams are incident on the first photoelectric converter and the second photoelectric converter, respectively. As described above, each of the first photoelectric converter and the second photoelectric converter receives the light beams passing through different pupil regions of the exit pupil of the image capturing optical system to perform photoelectric conversion, and thus it serves as a focus detection pixel. Each of the first photoelectric converter and the second photoelectric converter serves as an imaging pixel by adding (combining or synthesizing) signals of the first and second photoelectric converters.

The light beam from a specific point on the object 300 is divided into a light beam ΦLa that passes through a divided pupil corresponding to the first photoelectric converter to be incident on the first photoelectric converter and a light beam ΦLb that passes through a divided pupil corresponding to the second photoelectric converter to be incident on the second photoelectric converter. Since the two light beams are incident from a point on the object 300, in the state where the focus of the image capturing optical system is in the in-focus state, as illustrated in FIG. 3A, they pass through one microlens to reach a point on the image sensor 122. Accordingly, image signals obtained from the first photoelectric converter and the second photoelectric converter coincide with each other.

On the other hand, as illustrated in FIG. 3B, in the state where the focus is shifted by Y in an optical axis direction (out-of-focus state), arrival positions of the light beams ΦLa and ΦLb are shifted from each other by a change of an incident angle on the microlens in a direction perpendicular to the optical axis 301. Accordingly, a phase difference occurs between the image signals obtained from the first photoelectric converter and the second photoelectric converter. The first photoelectric converter and the second photoelectric converter photoelectrically convert two object images (image A and image B) with the phase difference to generate a signal (first signal) of the first photoelectric converter and a signal (second signal) of the second photoelectric converter. These signals are output to an outside of the image sensor 122 to be used for the focus detection.

As described above, the image sensor 122 performs first readout where the signal (first signal or focus detection signal) of the first photoelectric converter is independently read out and second readout where the signal (imaging signal) obtained by adding (combining or synthesizing) the signals of the first photoelectric converter and the second photoelectric converter. Hereinafter, the signals of the first photoelectric converter and the second photoelectric converter which are output from the image sensor 122 are referred to as images A and B, respectively, and the signal obtained by adding the first and second photoelectric converters is referred to as an image AB.

While this embodiment illustrates the configuration where the plurality of photoelectric converters are arranged to share one microlens and the pupil-divided light beams are incident on the respective photoelectric converters, the present invention is not limited thereto. For example, the focus detection pixel may include one PD (photodiode) under the microlens to shield light in the horizontal or vertical direction by a light shielding layer to perform pupil division. Alternatively, a pair of focus detection pixels are discretely arranged in an array of a plurality of imaging pixels to acquire the image signal A and the image signal B based on the pair of focus detection pixels.

Figure 4A:
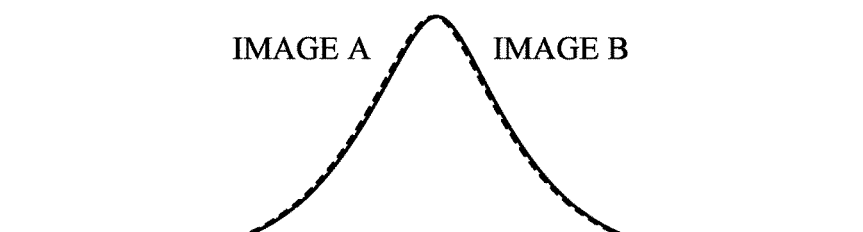
FIGS. 4A and 4B are explanatory diagrams of the focus detection by the phase difference detection method in each embodiment.
Figure 4B:
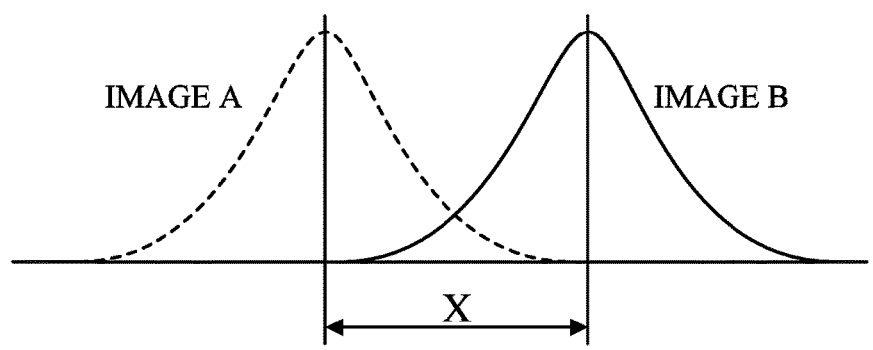

The phase difference AF unit 129 performs the focus detection by using the input images A and B. FIG. 4A is a graph of illustrating intensity distributions of the images A and B in the state of FIG. 3A (in-focus state). In FIG. 4A, a horizontal axis represents a pixel position, and a vertical axis represents an intensity of an output signal. When the focus is in the in-focus state, the image A and the image B coincide with each other. FIG. 4B illustrates intensity distributions of the images A and B in the state of FIG. 3B (out-of-focus state). In this case, the image A and the image B have a phase difference for the reasons above, and peak positions of the intensity are shifted from each other by the shift amount X. Phase difference AF unit 129 calculates the shift amount X for each frame and performs predetermined calculation processing by using the calculated shift amount X, and thus it calculates the shift amount of the focus, i.e., Y value in FIG. 3B. The phase difference AF unit 129 transfers the calculated Y value to the focus drive circuit 116.

The focus drive circuit 116 calculates a moving amount of the focus lens 104 based on the Y value acquired from the phase difference AF unit 129, and it outputs a drive signal to the focus actuator 113. The focus lens 104 moves up to a position (in-focus position) where the focus is in the in-focus state by the drive of the focus actuator 113, and thus the state where the focus is in the in-focus state is achieved.

Figure 5A:
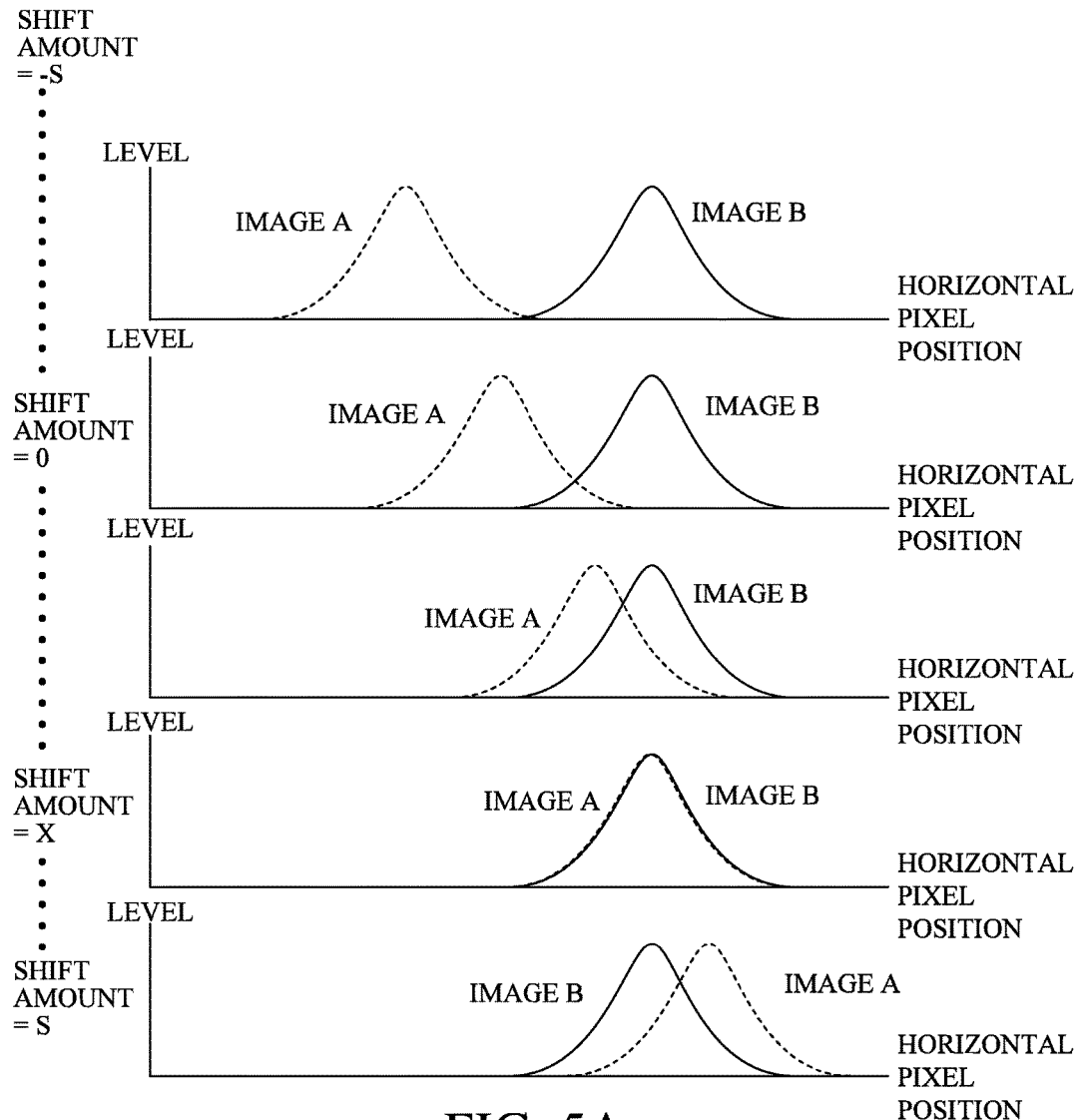
FIGS. 5A and 5B are explanatory diagrams of a correlation calculation in each embodiment.
Figure 5B:
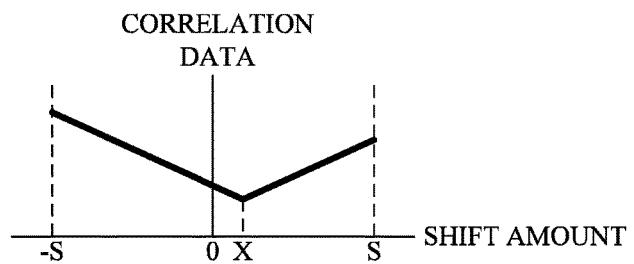

Next, referring to FIGS. 5A and 5B, a correlation calculation will be described. FIGS. 5A and 5B are exemplary diagrams of the correlation calculation. FIG. 5A is a plurality of graphs that indicate levels (intensities) of the images A and B with respect to a position (horizontal pixel position) in the horizontal direction of pixels. FIG. 5A illustrates a plurality of graphs on conditions that the position of the image A moves (performs shift movement) within a range of the shift amount −S to S. In this embodiment, a shift amount when the image data A is shifted to the left is set as a minus sign, and the shift amount when the image data A is shifted to the right is set as a plus sign. An absolute value of the difference between the images A and B corresponding to each position is calculated and a value obtained by adding the absolute values of the respective pixel positions (absolute value data) is calculated as a correlation value (correlation amount or correlation data) for one row. The correlation value calculated by each row may be added in each shift amount over a plurality of rows.

FIG. 5B is a graph of illustrating the correlation value (correlation data) calculated for each shift amount as an example of FIG. 5A. In FIG. 5B, the horizontal axis illustrates a shift amount, and the vertical axis indicates the correlation data. In an example illustrated in FIG. 5A, the images A and B are located at a focal position where they overlap with each other on condition that the shift amount is equal to X. In this case, as illustrated in FIG. 5B, the correlation value (correlation data) is minimized when the shift amount is equal to X. Methods of calculating the correlation value which can be applied to this embodiment is not limited thereto. Any methods can be applied as long as it is a method of calculating the correlation between the image A and the image B.

Figure 6:
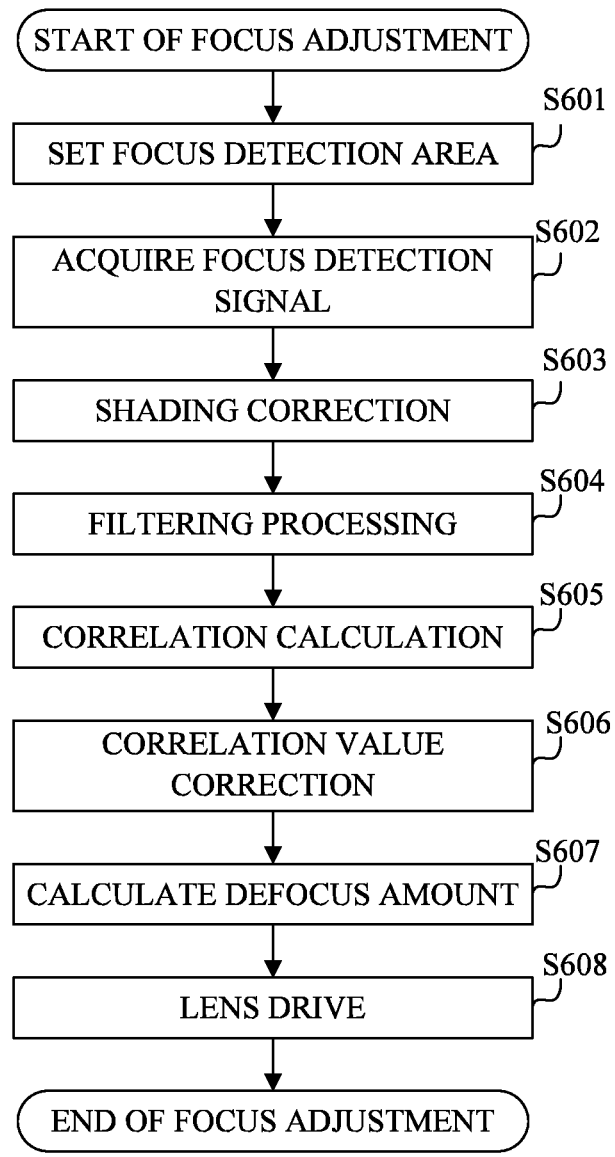
FIG. 6 is a flowchart of a focus adjustment in each embodiment.

Next, referring to FIG. 6, focus adjustment (focus control) in this embodiment will be described. FIG. 6 is a flowchart (main flow) of the focus adjustment in this embodiment. Each step of FIG. 6 is performed mainly by the phase difference AF unit 129, the focus actuator 113, the focus drive circuit 116, or the lens MPU 117 based on instructions of the camera MPU 125.

First, at step S601, the phase difference AF unit 129 sets a focus detection area as a target of the focus adjustment from an effective pixel area of the image sensor 122. Subsequently, at step S602, the camera MPU 125 (phase difference AF unit 129) acquires a signal (first signal or image A) of the first photoelectric converter and a signal (second signal or image B) of the second photoelectric converter from the image sensor 122. Subsequently, at step S603, the camera MPU 125 (phase difference AF unit 129) performs shading correction processing (optical correction processing) on each of the image A and the image B. In the focus detection by the phase difference detection method, the focus (focus state) is detected based on a correlation between the image A and the image B (i.e., coincidence of the signals). When the shading occurs, the correlation between the image A and the image B may be decreased. In this embodiment, it is preferred that the shading correction processing is performed to improve the correlation between the image A and the image B to perform the focus detection satisfactorily.

Subsequently, at step S604, the camera MPU 125 (phase difference AF unit 129) performs filtering processing on each of the image A and the image B. Commonly, in the focus detection by the phase difference detection method, the focus detection is performed in a large defocus state, and accordingly a pass band of the filtering processing includes a low-frequency band. However, if necessary when performing the focus adjustment from the large defocus state to a small defocus state, the pass band of the filtering processing during the focus detection may be adjusted to move to a high-frequency band.

Subsequently, at step S605, the phase difference AF unit 129 performs the correlation calculation described above on each of the image A and the image B where the filtering processing is performed, and it calculates a correlation value (correlation calculation result of the image A and the image B) that represents a coincidence of the signals. Subsequently, at step S606, the phase difference AF unit 129 (camera MPU 125) corrects the correlation value (correlation calculation result) calculated at step S605 (correlation value correction). Details of the correlation value correction will be described referring to FIG. 8 below.

Subsequently, at step S607, the phase difference AF unit 129 calculates a defocus amount based on the correlation value (corrected correlation value) corrected at step S606. Specifically, the phase difference AF unit 129 performs subpixel calculation to calculate an image shift amount X based on a shift amount where the correlation value (corrected correlation value) is minimized. Then, the phase difference AF unit 129 multiplies the image shift amount X by an image height of the focus detection area, an F number (aperture value) of the aperture stop 102, and a conversion coefficient depending on an exit pupil distance of the lens unit 100 to calculate the defocus amount. Subsequently, at step S608, the camera MPU 125, the lens MPU 117, the focus drive circuit 116, the focus actuator 113 drive the focus lens 104 based on the defocus amount calculated at step S607 (lens drive). Thus, the flow related to the focus adjustment is finished.

(Correction of Correlation Value)

Figure 7A:
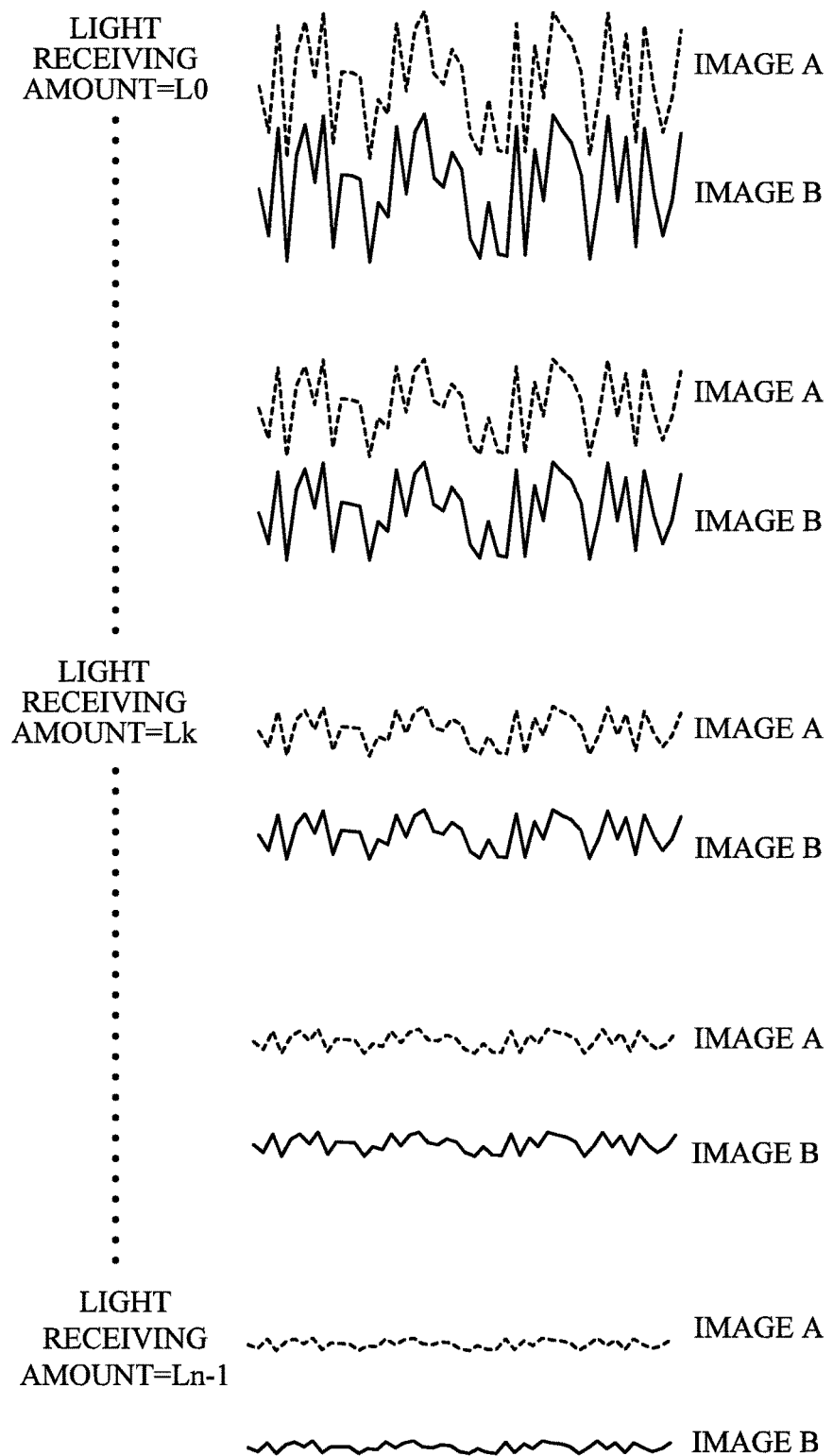
FIG. 7A is explanatory diagram of noises of images A and B.

Next, referring to FIGS. 7A and 7B, a concept of the correlation value correction (correlation amount correction) in this embodiment will be described. FIG. 7A is an explanatory diagram of noises of the images A and B, and it illustrates noise included in each of the images A and B for each pixel. In FIG. 7A, a horizontal axis indicates a pixel position and a vertical axis indicates an intensity of an output signal. For easy understanding of the images A and B, for convenience, the images A and B are illustrated while shifting reference positions of the images A and B each other in the vertical direction. A plurality of graphs illustrated in FIG. 7A correspond to states where a sum of the light receiving amounts of the first and second photoelectric converters changes within a range of L0 to Ln-1, respectively. In this embodiment, the sum of the light receiving amounts of the first and second photoelectric converters is described as an example, and alternatively only one of the light receiving amounts of the first and second photoelectric converters may be used. The light receiving amount has a relation of L0>Lk>Ln-1.

The noise for each pixel illustrated in FIG. 7A is a fixed pattern noise that occurs commonly in the images A and B, and with respect to the same pixel, the intensities of the output signals of the images A and B are the same. The noise that occurs commonly in the images A and B is caused by sharing the photodiode, the color filter, a capacitor, a readout circuit, an amplification circuit, and the like. Due to variation of each of sensitivities, properties, capacities, and resistors of them for each pixel, the intensities of the output signals vary in a pixel position direction, which results in occurrence of the noise. On the other hand, since the intensities of the output signals of the images A and B of the noise related to these components are the same, the images A and B have in-phase noises. The variation for each pixel described above changes in proportional to the light receiving amount, and therefore as illustrated in FIG. 7A, the amplification of the noise is reduced with decreasing the light receiving amount from L0 to Ln-1.

Figure 7B:
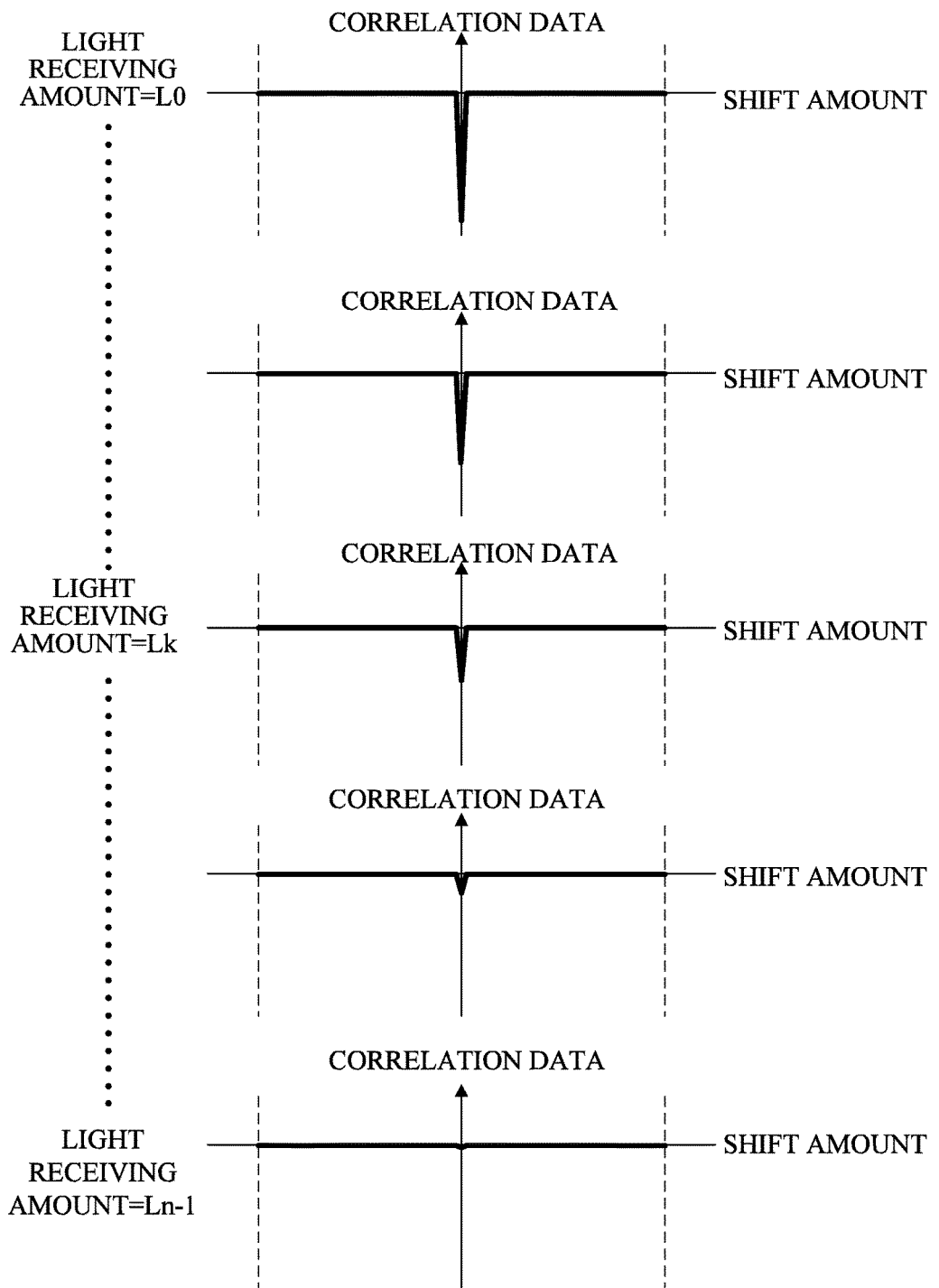
FIG. 7B is an explanatory diagram of a correlation value calculated based on the images A and B including noises.

The plurality of graphs in FIG. 7B illustrate correlation values that are calculated with respect to the light receiving amounts of the images A and B of FIG. 7A. In FIG. 7B, a horizontal axis of each graph indicates a shift amount, and a vertical axis of each graph indicates a correlation values (correlation data). As illustrated in FIG. 7B, when the shift amount is equal to 0, the correlation value is calculated to be small compared to that of another shift amount, and the minimum value occurs on condition that the shift amount is equal to zero. This is because output intensities of the fixed pattern noises occurring commonly in the images A and B are identical and the images coincide with each other when the shift amount is equal to zero. In addition, the amplitude of the noise increases with increasing the light receiving amount. Accordingly, the coincidence of the images A and B is lowered on condition that the shift amount is not equal to zero as the light receiving amount increases. As a result, the minimum value occurring by the shift amount of zero (i.e., difference between the correlation data when the shift amount is not equal to zero and the correlation data when the shift amount is equal to zero) increases with increasing the light receiving amount.

As described above, the fixed pattern noise occurring commonly in the images A and B increases the coincidence of the images A and B when the shift amount is equal to zero. In this embodiment, the correlation value of the fixed pattern noise occurring commonly in the images A and B is subtracted from the correlation calculation result (i.e., correlation value calculated based on the first signal and the second signal). As a result, it is possible to perform the correlation value correction while reducing the influence of the fixed pattern noise occurring commonly in the images A and B.

Figure 8:
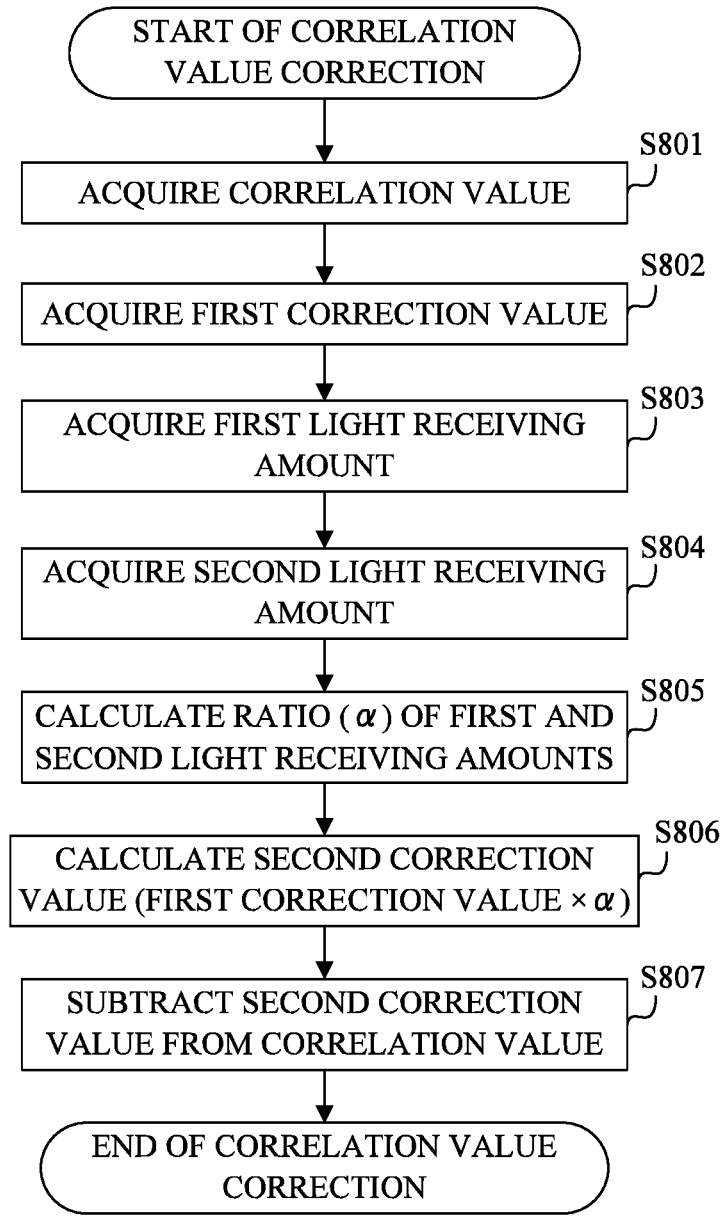
FIG. 8 is a flowchart of a correlation value correction in Embodiment 1.

Next, referring to FIGS. 8 and 9A to 9D, the correlation value correction (step S606 in FIG. 6) in this embodiment will be described. FIG. 8 is a flowchart of the correlation value correction in this embodiment. Each step of FIG. 8 is performed mainly by the camera MPU 125 and the phase difference AF unit 129. FIGS. 9A to 9D are explanatory diagrams of the correlation amount correction in this embodiment, and they illustrate correlation calculation results where the image A and the image B are shifted by the shift amount X. In each of FIGS. 9A to 9D, a horizontal axis indicates a shift amount and a vertical axis indicates a correlation value (correlation data).

Figure 9A:
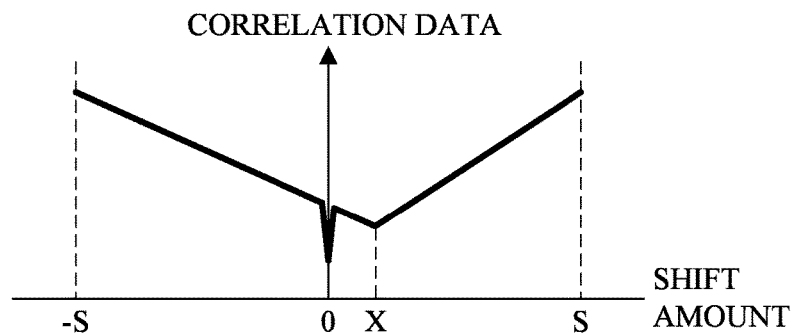
FIGS. 9A to 9D are explanatory diagrams of the correlation value correction in Embodiment 1.

First, at step S801 in FIG. 8, the camera MPU 125 acquires the correlation value (correlation calculation result) calculated at step S605 in FIG. 6. As illustrated in FIG. 9A, the acquired correlation value indicates a high coincidence between the images A and B and it indicates a minimum value at the position of the shift amount of X due to the shift amount X between the images A and B. In addition, the correlation value indicates a minimum value at the shift amount of 0 due to a fixed pattern noise that occurs commonly in the images A and B as described above. This is because the state of FIG. 5B as described above and the state of FIG. 7B depending on the light receiving amount caused by the fixed pattern noise that occurs commonly in the images A and B are superimposed. Thus, when the fixed pattern noise that occurs commonly in the images A and B is included, the plurality of minimum values (minimum points) occur as a correlation calculation result, and accordingly it is not possible to perform the focus detection with high accuracy.

Figure 9B:
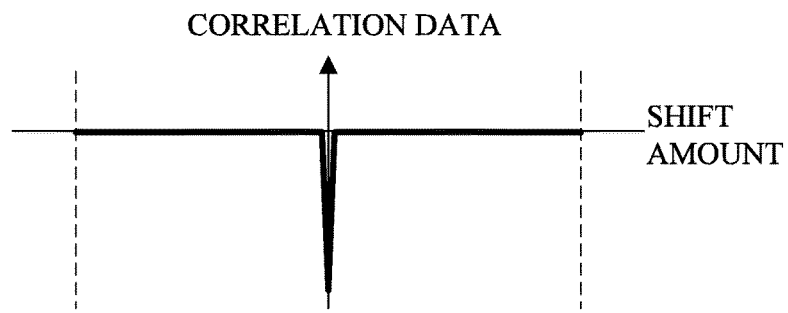

Subsequently, at step S802 of FIG. 8, the camera MPU 125 acquires a first correction value that is stored in the memory (storage unit) 128. As illustrated in FIG. 9B, the first correction value is a correlation value (representative value) corresponding to the light receiving amount L0 in FIG. 7B. In this embodiment, for example, the correction value for the light receiving amount L0 is stored as the first correction value, but this embodiment is not limited thereto and a correction value corresponding to another light receiving amount may be stored as the first correction value. Subsequently, at step S803, the camera MPU 125 acquires a first light receiving amount that is stored in the memory 128. The first light receiving amount is a sum of light receiving amounts of the images A and B corresponding to the first correction value acquired at step S802, and in this embodiment, it corresponds to the light receiving amount L0. The first correction value may be stored in an internal memory (built-in memory) of the camera MPU 125 such as the EEPROM 125c, instead of the memory 128 provided outside the camera MPU 125.

Subsequently, at step S804, the camera MPU 125 acquires a second light receiving amount from intensities of output signals of the images A and B of the image sensor 122. In this embodiment, the second light receiving amount is acquired from the intensities of the output signals of the images A and B of the camera MPU 125, or alternatively the second light receiving amount may be acquired from information such as an AE sensor. The second light receiving amount is a sum of the light receiving amounts of the images A and B used for the correlation calculation at step S605 of FIG. 6. In this embodiment, for example, a case where the second light receiving amount is a light receiving amount Lk will be described. In this embodiment, while each of the first light receiving amount and the second light receiving amount is a sum of the light receiving amounts of the images A and B, it is not limited thereto. Each of the first light receiving amount and the second light receiving amount may be the light receiving amount of the image A, or alternatively each of the first light receiving amount and the second light receiving amount may be the light receiving amount of the image B (i.e., one of the light receiving amount of the image A or the light receiving amount of the image B may be both the first and second light receiving amounts). The same is applied to other embodiments.

Figure 9C:
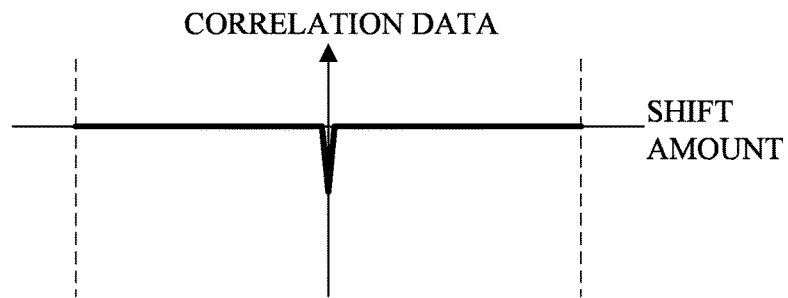

Subsequently, at step S805, the camera MPU 125 calculates a ratio ($\alpha=Lk/L0$) of the first light receiving amount acquired at step S803 and the second light receiving amount acquired at step S804. Subsequently, at step S806, the camera MPU 125 calculates a second correction value based on the product (first correction value$\times\alpha$) of the first correction value acquired at step S802 and the ratio ($\alpha$) of the first and second light receiving amounts calculated at step S805. As illustrated in FIG. 9C, the second correction value is a value which is obtained by converting the correlation value for the light receiving amount Lk of FIG. 7B based on the first correction value as a correction value for the light receiving amount L0. As described above, the second correction value (i.e., correction value depending on the light receiving amount) is calculated by converting the first correction value (predetermined correction value) based on the light receiving amount (i.e., the ratio of the first and the second light receiving amount in this embodiment), based on the ratio of the representative value of the correction value and the light receiving amount. Accordingly, it is possible to reduce a storage capacity of the memory 128.

Figure 9D:
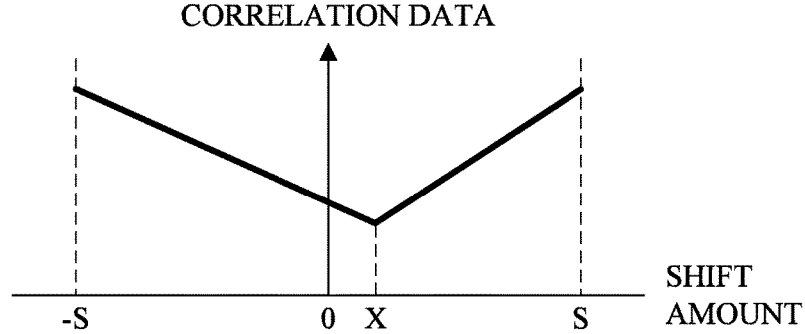

Subsequently, at step S807, the camera MPU 125 subtracts the second correction value calculated at step S806 from the correlation value (correlation calculation result) acquired at step S801. Even if a plurality of minimum values appear in the correlation calculation result (correlation value or correlation data) as illustrated in FIG. 9A, a minimum value caused by the fixed pattern noise that occurs commonly in the images A and B is canceled at the shift amount of 0 as illustrated in FIG. 9D when the second correction value is subtracted from the correlation value. As described above, by subtracting the second correction value from the correlation value, the correlation calculation result (corrected correlation value or corrected correlation data) where the noise has been corrected can be obtained.

As described above, in this embodiment, a control apparatus (camera MPU 125 and phase difference AF unit 129) includes the acquirer 129a and the calculator 129b. The acquirer 129a acquires a first signal and a second signal that correspond to output signals of a first photoelectric converter and a second photoelectric converter, respectively, and the first and second photoelectric converters receive light beams passing through different pupil regions of the image capturing optical system from each other. The calculator 129b calculates a correlation value of the first signal and the second signal to calculate a defocus amount based on the correlation value. Furthermore, the calculator 129b corrects the correlation value based on a light receiving amount of at least one of the first photoelectric converter and the second photoelectric converter. Instead of the calculator 129b, the camera MPU 125 may correct the correlation value, and the correlation value corrected by the camera MPU 125 may be sent to the phase difference AF unit 129 (calculator 129b).

Preferably, the calculator 129b calculates a correction value (second correction value) based on the light receiving amount (second light receiving amount) of at least one of the first photoelectric converter and the second photoelectric converter, and a predetermined light receiving amount (first light receiving amount), and it corrects the correlation value by using the calculated correction value. More preferably, the calculator 129b calculates the correction value based on a ratio of the light receiving amount (second light receiving amount) and the predetermined light receiving amount (first light receiving amount). More preferably, the calculator 129b uses a first correction value corresponding to the predetermined light receiving amount and the ratio $\alpha$ of the light receiving amount and the predetermined light receiving amount to calculate the correction value as a second correction value. More preferably, the first correction value is a correlation value of noises of the first photoelectric converter and the second photoelectric converter. Preferably, the control apparatus includes a memory (EEPROM 125c or memory 128) that stores the predetermined light receiving amount of at least one of the first photoelectric converter and the second photoelectric converter, and the first correction value corresponding to the predetermined light receiving amount. Preferably, the calculator 129b subtracts the correction value from the correlation value to correct the correlation value.

According to this embodiment, even when a correlation value caused by a fixed pattern noise occurring commonly in the images A and B, which is not relevant to a correlation value obtained from an object image, is superimposed on a correlation calculation result, the correlation value of the object image can be calculated to detect an appropriate focus position (focus state). As a result, it is possible to perform focus detection with high accuracy while reducing the influence of a noise for each pixel.

Embodiment 2

Next, Embodiment 2 of the present invention will be described. This embodiment is different from Embodiment 1 with respect to the method of the correlation value correction. Other configurations and operations in this embodiment are the same as those in Embodiment 1, and accordingly descriptions thereof are omitted.

Figure 10:
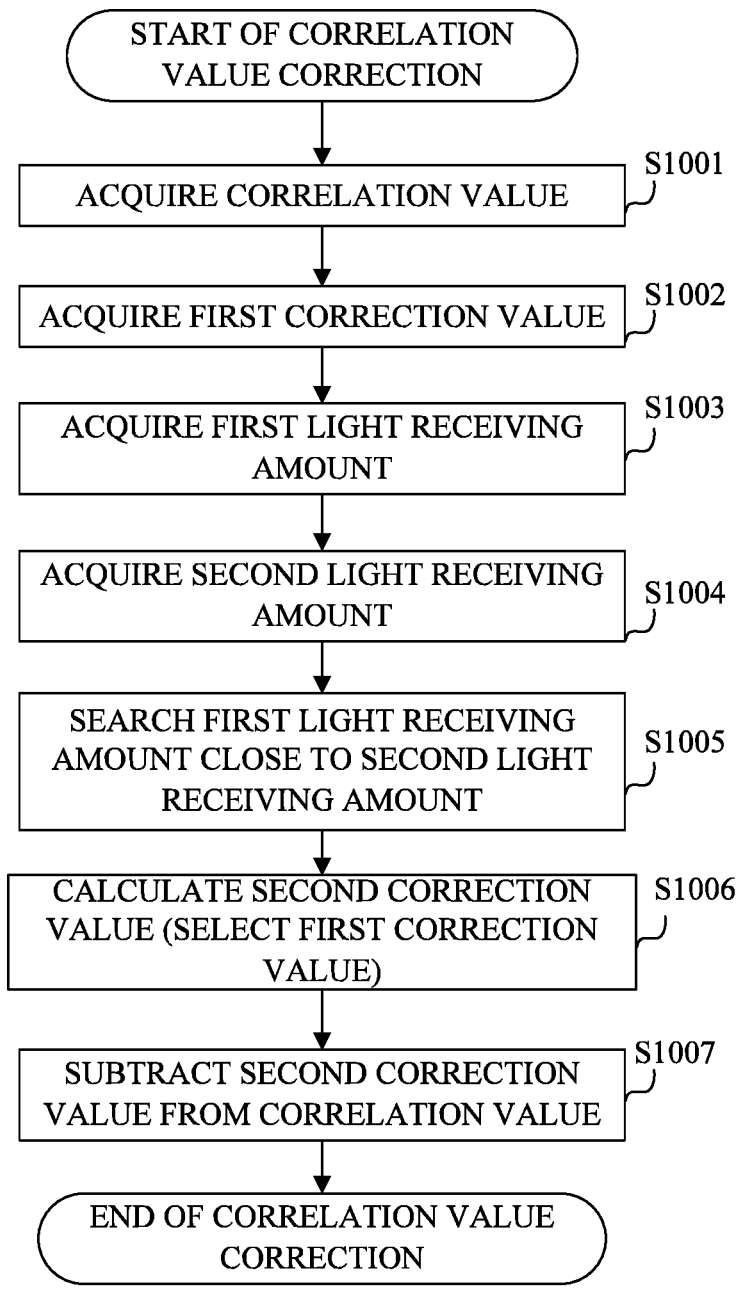
FIG. 10 is a flowchart of a correlation value correction in Embodiment 2.

Referring to FIG. 10, the correlation value correction (step S606 in FIG. 6) in this embodiment will be described. FIG. 10 is a flowchart of the correlation value correction in this embodiment. Each step of FIG. 10 is performed mainly by the camera MPU 125 and the phase difference AF unit 129.

First, at step S1001, the camera MPU 125 acquires the correlation value (correlation calculation result) calculated at step S605 in FIG. 6. As illustrated in FIG. 9A, the acquired correlation value indicates a high coincidence between the images A and B and it indicates a minimum value at the position of the shift amount of X due to the shift amount X between the images A and B. In addition, the correlation value indicates a minimum value at the shift amount of 0 due to a fixed pattern noise that occurs commonly in the images A and B as described above.

Subsequently, at step S1002, the camera MPU 125 acquires first correction values that are stored in the memory (storage unit) 128. As illustrated in FIG. 7B, the first correction values are a plurality of correlation values that correspond to the plurality of light receiving amounts (L0 to Ln-1), respectively. Thus, this embodiment stores, as first correction values, the plurality of correlation values corresponding to the respective light receiving amounts, which is different from Embodiment 1 where only a predetermined correction value (representative value) is stored as a first correction value.

Subsequently, at step S1003, the camera MPU 125 acquires first light receiving amounts that are stored in the memory 128. The first light receiving amounts are sums of light receiving amounts of the images A and B corresponding to the respective first correction values acquired at step S1002. Subsequently, at step S1004, the camera MPU 125 acquires a second light receiving amount from intensities of output signals of the images A and B of the image sensor 122.

Subsequently, at step S1005, the camera MPU 125 searches a first light receiving amount (one light receiving amount) which is closest to the second light receiving amount acquired at step S1004 from among the first light receiving amounts (the plurality of light receiving amounts) acquired at step S1003. Subsequently, at step S1006, the camera MPU 125 selects and acquires a second correction value from among the first correction values acquired at step S1002. In other words, the camera MPU 125 selects, as a second correction value, the first correction value (i.e., one first correction value selected from the plurality of first correction values) that corresponds to the first light receiving amount (i.e., first light receiving amount closest to the second light receiving amount) that is searched at step S1005.

Subsequently, at step S1007, the camera MPU 125 subtracts the second correction value calculated at step S1006 from the correlation value (correlation calculation result) acquired at step S1001. Even if a plurality of minimum values appear in the correlation calculation result (correlation value or correlation data) as illustrated in FIG. 9A, a minimum value caused by the fixed pattern noise that occurs commonly in the images A and B is canceled at the shift amount of 0 as illustrated in FIG. 9D when the second correction value is subtracted from the correlation value. As described above, by subtracting the second correction value from the correlation value, the correlation calculation result (corrected correlation value or corrected correlation data) where the noise has been corrected can be obtained.

As described above, in this embodiment, the control apparatus (image capturing apparatus 10) includes a memory (EEPROM 125c or memory 128) that stores a plurality of light receiving amounts, and a plurality of correction values corresponding to the respective light receiving amounts. The calculator 129b searches one light receiving amount which is closest to the light receiving amount of at least one of the first photoelectric converter and the second photoelectric converter from the plurality of light receiving amounts. Then, the calculator 129b selects a correction value (second correction value) corresponding to the one light receiving amount from the plurality of correction values (first correction values).

According to this embodiment, even when a correlation value caused by a fixed pattern noise occurring commonly in the images A and B, which is not relevant to a correlation value obtained from an object image, is superimposed on a correlation calculation result, the correlation value of the object image can be calculated to detect an appropriate focus position (focus state). As a result, it is possible to perform focus detection with high accuracy while reducing the influence of a noise for each pixel.

Embodiment 3

Next, Embodiment 3 of the present invention will be described. This embodiment is different from Embodiment 1 with respect to the method of the correlation value correction. Other configurations and operations in this embodiment are the same as those in Embodiment 1, and accordingly descriptions thereof are omitted.

Figure 11:
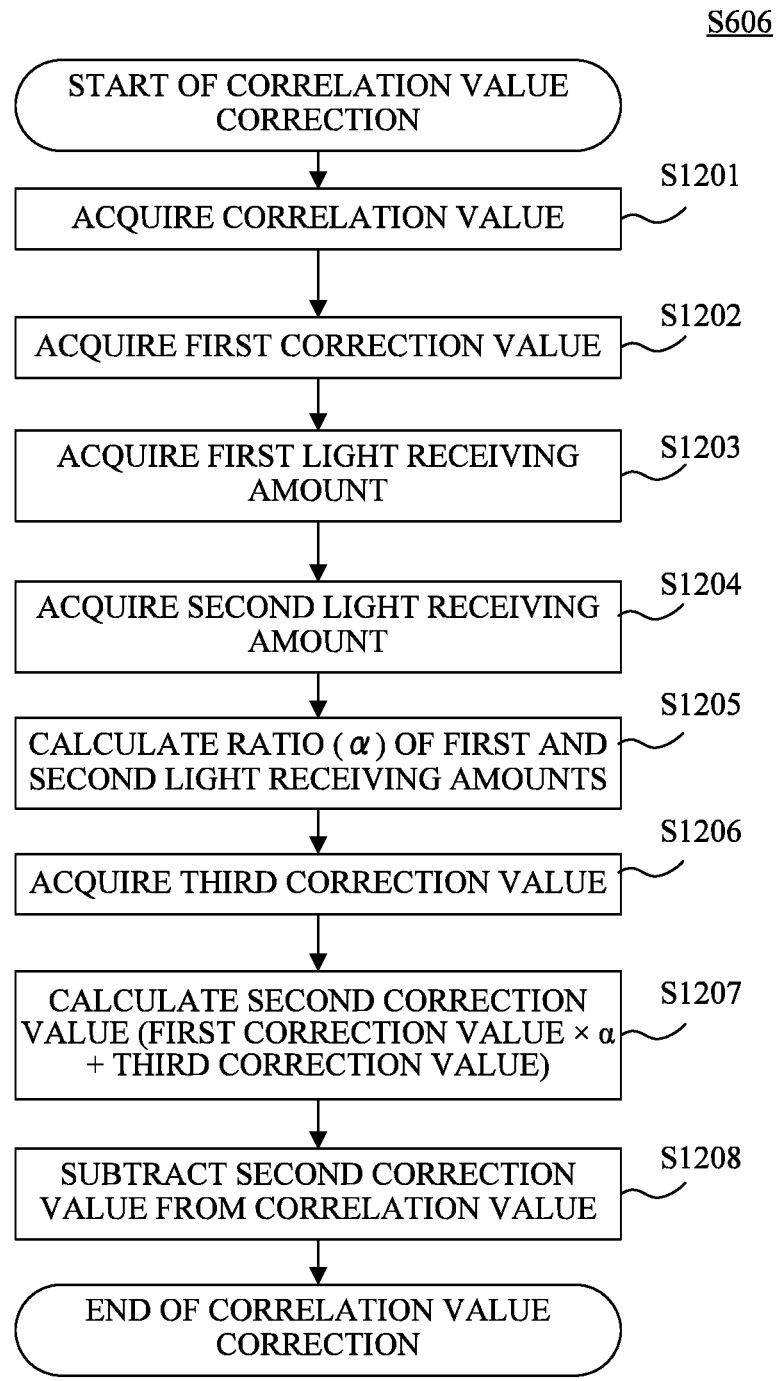
FIG. 11 is a flowchart of a correlation value correction in Embodiment 3.

Next, referring to FIGS. 11, 12A to 12F, and 13A to 13F, the correlation value correction (step S606 in FIG. 6) in this embodiment will be described. FIG. 11 is a flowchart of the correlation value correction in this embodiment. Each step of FIG. 11 is performed mainly by the camera MPU 125 and the phase difference AF unit 129. FIGS. 12A to 12F are explanatory diagrams of the correlation amount correction in this embodiment, and they illustrate correlation values (correlation data) when the image A and the image B are shifted by a shift amount X from each other. FIGS. 13A to 13F illustrate correlation calculation results where the light receiving amount is small and the shift amount X of the image A and the image B is equal to zero. In each of FIGS. 12A to 12F and 13A to 13F, a horizontal axis indicates a shift amount and a vertical axis indicates a correlation value (correlation data).

Figure 12D:
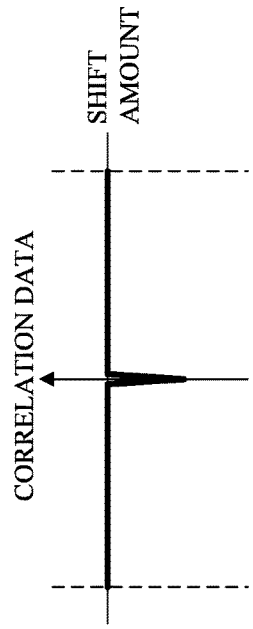
FIGS. 12A to 12F are explanatory diagrams of the correlation value correction in Embodiment 3.
Figure 12E:
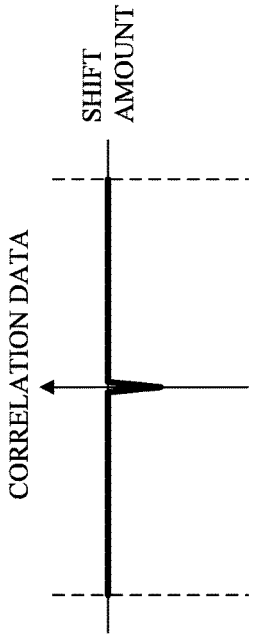
Figure 12F:
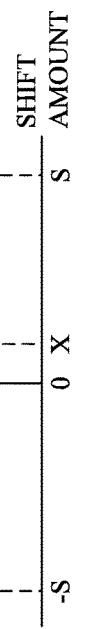
Figure 12A:
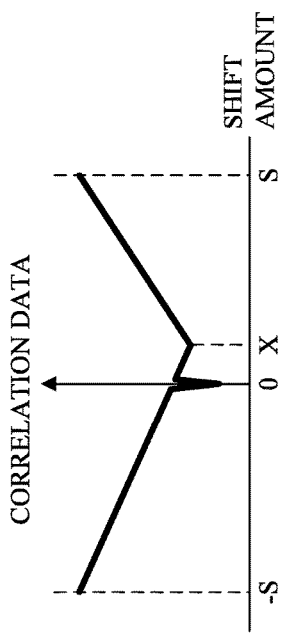

First, at step S1201 in FIG. 11, the camera MPU 125 acquires the correlation value (correlation calculation result) calculated at step S605 in FIG. 6. As illustrated in FIG. 12A, the acquired correlation value indicates a high coincidence between the images A and B and it indicates a minimum value at the position of the shift amount of X due to the shift amount X between the images A and B. In addition, the correlation value indicates a minimum value at the shift amount of 0 due to a fixed pattern noise that occurs commonly in the images A and B as described above. On the other hand, since the shift amount X between the images A and B is equal to zero in the case of FIG. 13A, the coincidence of the images A and B near the shift amount of 0 gets higher to indicate the minimum value. In addition, due to the noise caused by subtracting the signal (image A) of the first photoelectric converter from an addition signal (combined signal or image AB) of the first and the second photoelectric converters to obtain the signal corresponding to the signal (image B) of the second photoelectric converter, a maximum value appears at a position where the shift amount is equal to zero.

Figure 14A:
FIGS. 14A and 14B are explanatory diagrams of noises and the correlation value in Embodiment 3, respectively.
Figure 14B:
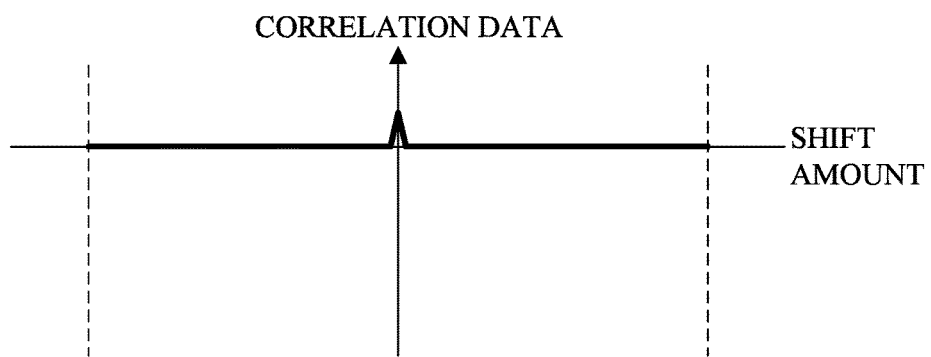

Referring to FIGS. 14A and 14B, the noise caused by subtracting the image A from the image AB to obtain the signal corresponding to the image B will be described. FIGS. 14A and 14B are explanatory diagrams of the noise and the correlation value in this embodiment. FIG. 14A illustrates the noise caused by subtracting the image A from the image AB to obtain the signal corresponding to the image B, and a horizontal axis and a vertical axis indicate a pixel position and an intensity of an output signal, respectively. For convenience, the images A and B are illustrated while shifting reference positions of the images A and B each other in the vertical direction. When the image B is generated from the image AB and the image A to perform the correlation calculation, a random noise amount where a sign of a random noise amount superimposed on the image A is inversed is superimposed on the image B. The image B indicates a minimum value at a position where the image A indicates a maximum value, and thus the image A and the image B have noises with reverse phases. Accordingly, the coincidence of the images A and B where the shift amount is equal to zero is decreased, and the maximum value appears at the position where the shift amount is equal to zero. FIG. 14B illustrates a graph of the correlation value in this case. A horizontal axis indicates a shift amount, and a vertical axis indicates a correlation value (correlation data). When the shift amount is equal to zero as illustrated in FIG. 14B, the correlation value is calculated to be large compared to that of another shift amount, and thus the maximum value occurs at the position where the shift amount is equal to zero.

As described above, each of the image A and the image B includes two types of noises containing the fixed pattern noise occurring commonly in the images A and B and the noise caused by subtracting the image A from the image AB to obtain the signal corresponding to the image B. The fixed pattern noise occurring commonly in the images A and B increases with increasing the light receiving amount, and the coincidence with respect to the shift amount of 0 gets higher to increase the minimum value. On the other hand, as the light receiving amount decreases, the coincidence where the shift amount is equal to zero is lowered and the minimum value is decreased.

On the other hand, the noise caused by subtracting the image A from the image AB to obtain the signal corresponding to the image B always exists by a certain amount without depending on the light receiving amount, and it always indicates a certain maximum value when the shift amount is equal to zero. Accordingly, when both the noises described above exist, the fixed pattern noise occurring commonly in the images A and B is dominant with increasing the light receiving amount, and accordingly the minimum value appears at the shift amount of 0. On the other hand, when the light receiving amount is small, the noise caused by subtracting the image A from the image B to obtain the signal corresponding to the image B is dominant, and thus the maximum value appears at the shift amount of 0.

Figure 13A:
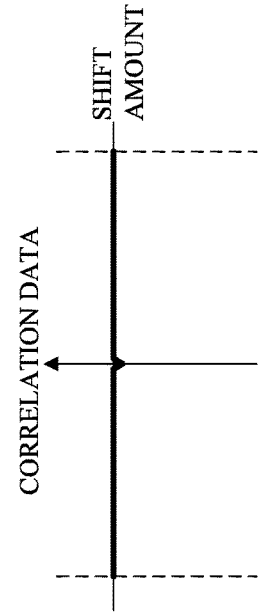
FIGS. 13A to 13F are explanatory diagrams of the correlation value correction in Embodiment 3.

Accordingly, in FIG. 12A illustrating a case where the light receiving amount is large, the minimum value appears at the shift amount of 0, and on the other hand, in FIG. 13A illustrating a case where the light receiving amount is small, the maximum value appears at the shift amount of 0. With respect to FIG. 12A, as described in Embodiment 1, a plurality of minimum points occur in the correlation value (correlation calculation result), and thus it is difficult to perform the focus detection with high accuracy. With respect to FIG. 13A, the maximum value occurs due to the noise although the minimum value is supposed to appear at the shift amount of zero since the shift amount of the images A and B is equal to zero, and accordingly it is difficult to perform the focus detection with high accuracy.

Figure 12B:
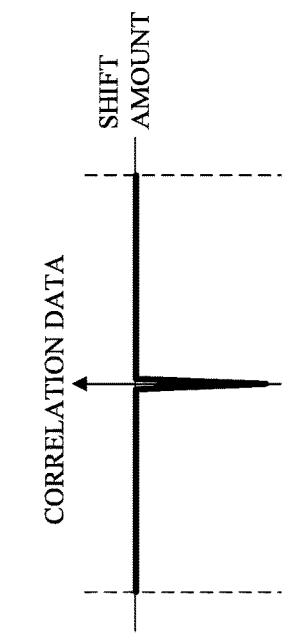
Figure 13B:
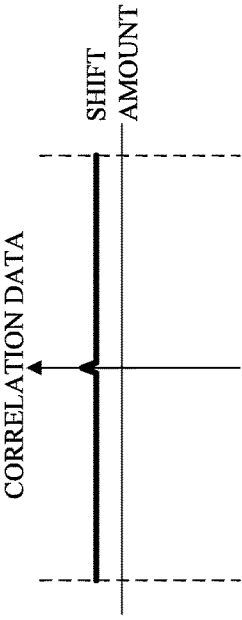

Subsequently, at step S1202 of FIG. 11, the camera MPU 125 acquires a first correction value that is stored in the memory 128. As illustrated in FIGS. 12B and 13B, for example, the first correction value is a correlation value (representative value) corresponding to the light receiving amount L0 in FIG. 7B. Subsequently, at step S1203, the camera MPU 125 acquires a first light receiving amount that is stored in the memory 128. Subsequently, at step S1204, the camera MPU 125 acquires a second light receiving amount from intensities of output signals of the images A and B. Subsequently, at step S1205, the camera MPU 125 calculates a ratio ($\alpha$=Lk/L0) of the first light receiving amount acquired at step S1203 and the second light receiving amount acquired at step S1204.

Figure 12C:
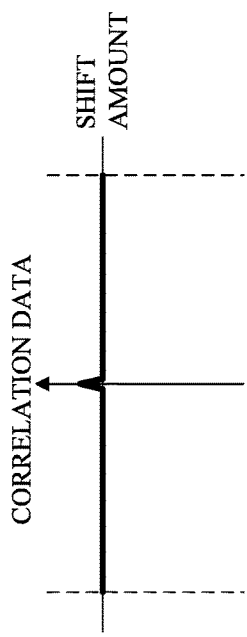
Figure 13C:
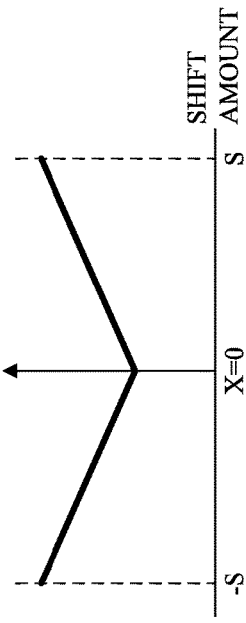

Subsequently, at step S1206, the camera MPU 125 acquires a third correction value that is stored in the memory 128. As illustrated in FIGS. 12C and 13C, the third correction value corresponds to a correlation value (FIG. 14B) of the noise caused by subtracting the image A from the image AB to obtain the signal corresponding to the image B. This embodiment is different from Embodiment 1 in that the third correction value is acquired to correct the correlation value.

Figure 13D:
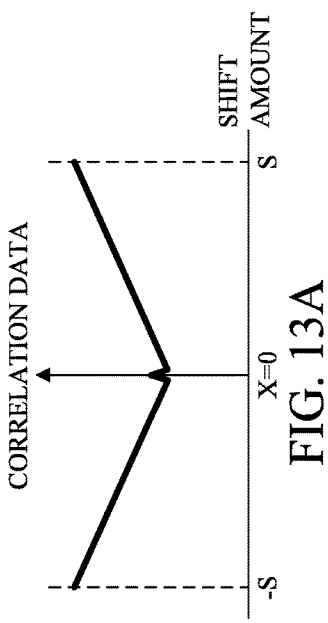
Figure 13E:
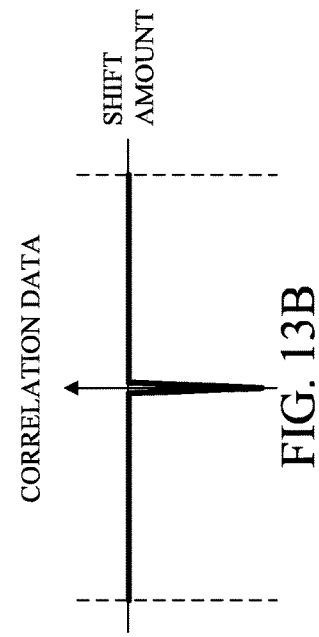

Subsequently, at step S1207, the camera MPU 125 calculates a second correction value based on the first correction value acquired at step S1202, the ratio $\alpha$ of the first light receiving amount and the second light receiving amount calculated at step S1205, and the third correction value acquired at step S1206. Specifically, the camera MPU 125 calculates the second correction value by a sum of a product of the first correction value and the ratio $\alpha$, and the second correction value (first correction value×$\alpha$+third correction value). FIGS. 12D and 13D illustrate the product of the first correction value and the ratio ($\alpha$) of the first and second light receiving amounts (first correction value×$\alpha$). FIGS. 12E and 13E illustrate sums (first correction value×$\alpha$+third correction value) of FIGS. 12D and 13D illustrating the first correction value×$\alpha$ and FIGS. 12C and 13C illustrating the third correction value, respectively. As illustrated in FIGS. 12D and 13D, the minimum value in FIG. 12D, which illustrates the case where the light receiving amount is large, is larger than that of the third correction value in FIG. 12C. On the other hand, in FIG. 13D illustrating the case where the light receiving amount is small, the minimum value is smaller than FIG. 13C illustrating the third correction value. Accordingly, in FIG. 12E corresponding to the sum of the first correction value×$\alpha$ and the third correction value, the fixed pattern noise occurring commonly in the images A and B is dominant, and thus the minimum value appears. As a result, in FIG. 13E, the noise caused by subtracting the image A from the image AB to obtain the signal corresponding to the image B is dominant, and thus the maximum value appears.

Figure 13F:
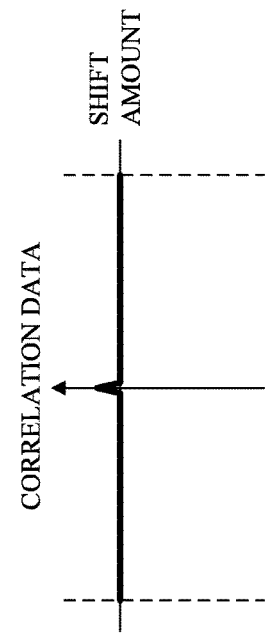

Subsequently, at step S1208, the camera MPU 125 subtracts the second correction value calculated at step S1207 from the correlation value (correlation calculation result) acquired at step S1201. Even if a plurality of minimum values appear in the correlation calculation result as illustrated in FIG. 12A, a minimum value caused by the fixed pattern noise that occurs commonly in the images A and B is canceled at the shift amount of 0 as illustrated in FIG. 12F when the subtraction of the second correction value is performed. Furthermore, even if a maximum value of the correlation value appears at the shift amount of 0 as illustrated in FIG. 13A, a minimum value caused by the noise, which is caused by subtracting the image A from the image AB at the shift amount of 0 as illustrated in FIG. 13F to obtain a signal corresponding to the image B, is canceled. As described above, by subtracting the second correction value from the correlation value, the correlation calculation result (corrected correlation value) where the noise has been corrected can be obtained.

As described above, in this embodiment, the phase difference AF unit 129 (calculator 129b) calculates the correction value as the second correction value by using the first correction value, the ratio α of the light receiving amount (second light receiving amount) and the predetermined light receiving amount (first light receiving amount), and the third correction value. More preferably, the phase difference AF unit 129 (acquirer 129a) acquires the first signal from the first photoelectric converter, and the second signal by subtracting the first signal from a combined signal of the first photoelectric converter and the second photoelectric converter. The third correction value corresponds to a correlation value of a noise occurring due to acquisition of the second signal. Preferably, the image capturing apparatus 10 includes a memory (EEPROM 125c or memory 128) that stores the predetermined light receiving amount of at least one of the first photoelectric converter or the second photoelectric converter, the first correction value corresponding to the predetermined light receiving amount, and the third correction value.

According to this embodiment, even when a correlation value caused by a fixed pattern noise occurring commonly in the images A and B, which is not relevant to a correlation value obtained from an object image, is superimposed on a correlation calculation result, the correlation value of the object image can be calculated to detect an appropriate focus position (focus state). Furthermore, according to this embodiment, even when a correlation value caused by a noise, which occurs by subtracting the image A from the image AB to obtain a signal corresponding to the image B, is superimposed on the correlation calculation result, the correlation value of the object image can be calculated to detect the appropriate focus position (focus state). As a result, it is possible to perform focus detection with high accuracy while reducing the influence of a noise for each pixel.

Embodiment 4

Next, Embodiment 4 of the present invention will be described. This embodiment is different from Embodiment 1 with respect to the method of the correlation value correction. Other configurations and operations in this embodiment are the same as those in Embodiment 1, and accordingly descriptions thereof are omitted.

Figure 15:
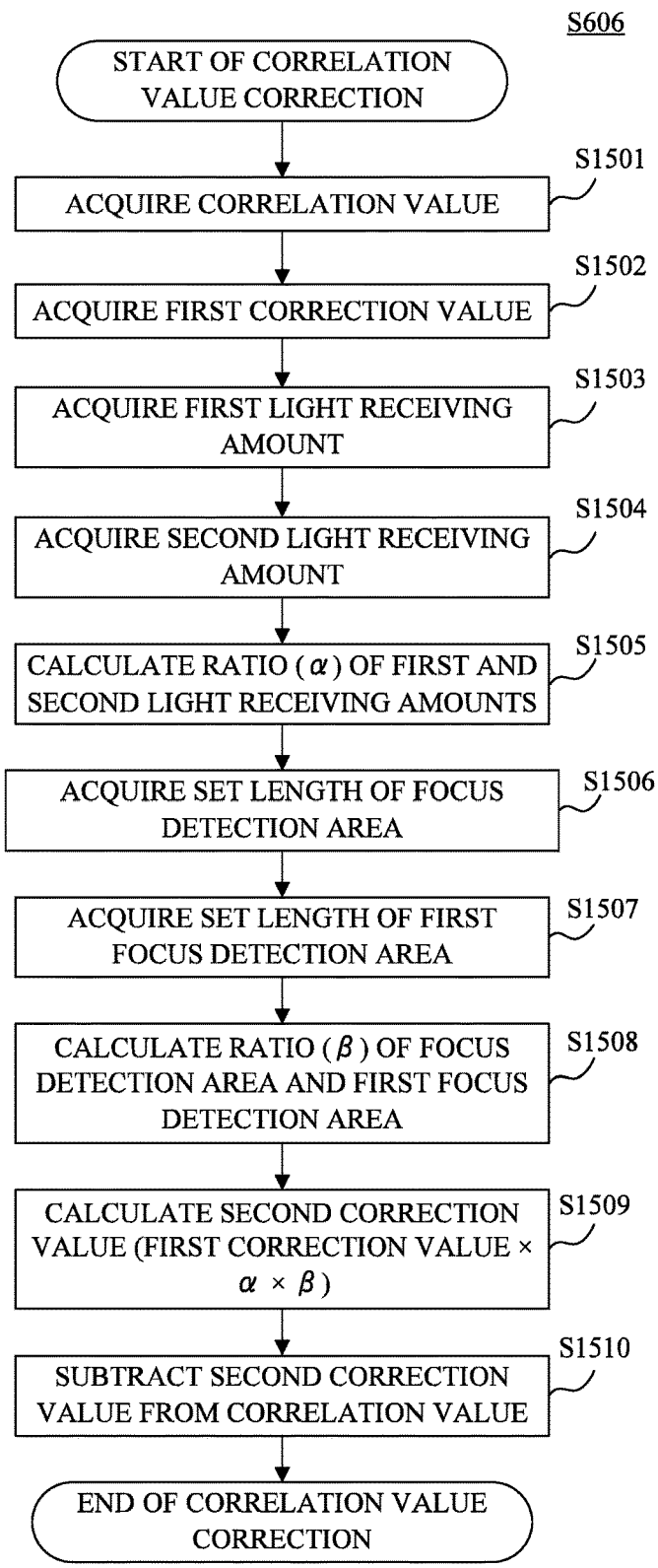
FIG. 15 is a flowchart of a correlation value correction in Embodiment 4.

Referring to FIGS. 15 and 16A to 16E, the correlation value correction (step S606 in FIG. 6) in this embodiment will be described. FIG. 15 is a flowchart of the correlation value correction in this embodiment. Each step of FIG. 15 is performed mainly by the camera MPU 125 and the phase difference AF unit 129. FIGS. 16A to 16E are explanatory diagrams of the correlation amount correction in this embodiment, and they illustrate correlation calculation results where the image A and the image B are shifted by the shift amount X. In each of FIGS. 16A to 16E, a horizontal axis indicates a shift amount and a vertical axis indicates a correlation value (correlation data).

Figure 16A:
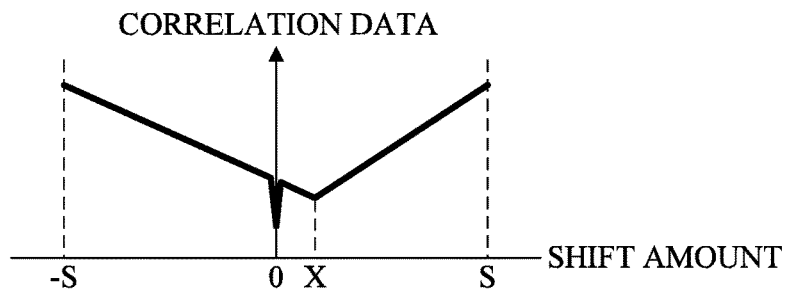
FIGS. 16A to 16E are explanatory diagrams of the correlation value correction in Embodiment 4.

First, at step S1501 in FIG. 15, the camera MPU 125 acquires the correlation value (correlation calculation result) calculated at step S605 in FIG. 6. As illustrated in FIG. 16A, the acquired correlation value indicates a high coincidence between the images A and B and it indicates a minimum value at the position of the shift amount of X due to the shift amount X between the images A and B. In addition, the correlation value indicates a minimum value at the shift amount of 0 due to a fixed pattern noise that occurs commonly in the images A and B as described above.

Figure 16B:
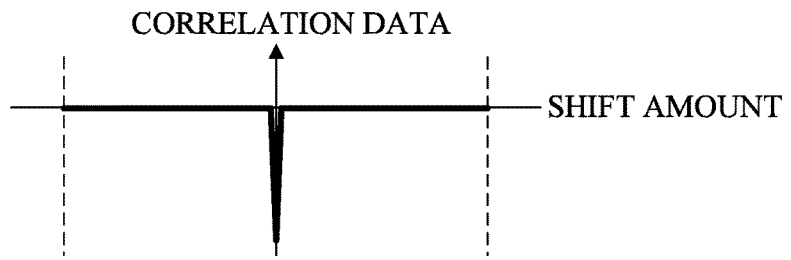

Subsequently, at step S1502, the camera MPU 125 acquires a first correction value that is stored in the memory (storage unit) 128. As illustrated in FIG. 16B, the first correction value is a correlation value (representative value) corresponding to the light receiving amount L0 in FIG. 7B. Subsequently, at step S1503, the camera MPU 125 acquires a first light receiving amount that is stored in the memory 128. The first light receiving amount is a sum of light receiving amounts of the images A and B corresponding to the first correction value acquired at step S1502, and in this embodiment, it corresponds to the light receiving amount L0.

Subsequently, at step S1504, the camera MPU 125 acquires a second light receiving amount from intensities of output signals of the images A and B of the image sensor 122. Subsequently, at step S1505, the camera MPU 125 calculates a ratio ($\alpha=Lk/L0$) of the first light receiving amount acquired at step S1503 and the second light receiving amount acquired at step S1504.

Figure 17:
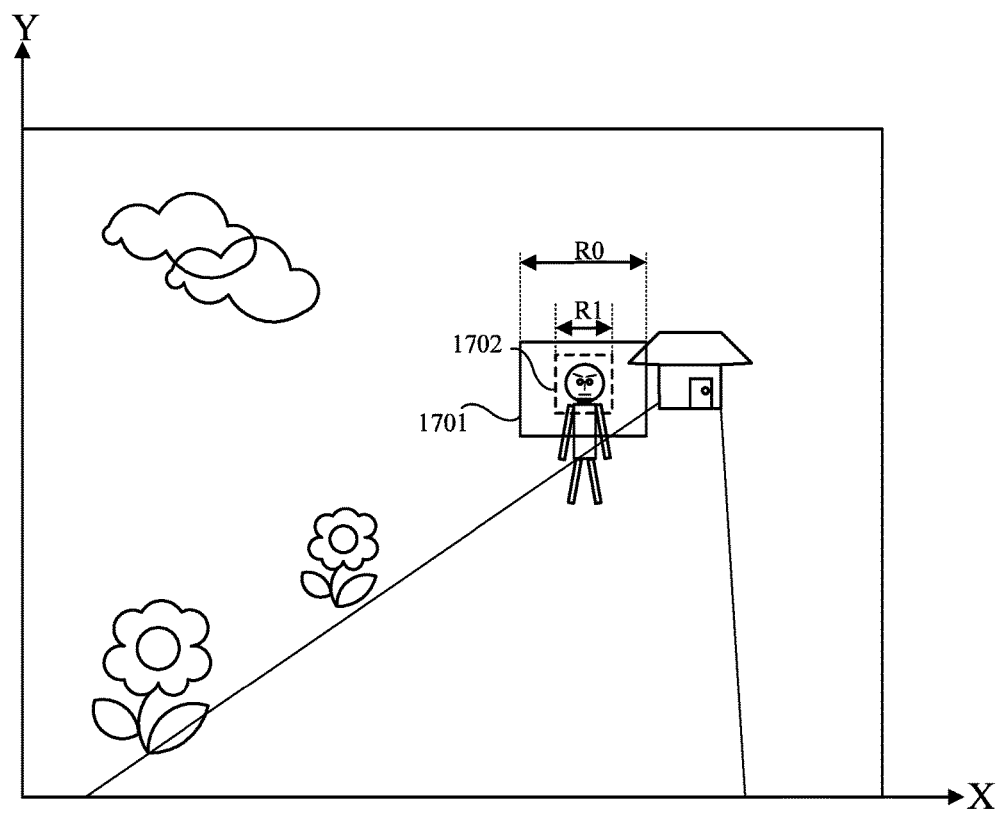
FIG. 17 is an explanatory diagram of a set length of a focus detection area in Embodiment 4.

Subsequently, at step S1506, the camera MPU 125 acquires a set length of the focus detection area set at step S601 of FIG. 6. The set length of the focus detection area varies depending on a mode. FIG. 17 is an explanatory diagram of the set length of the focus detection area. Typically, as illustrated in FIG. 17, in a normal mode, a focus detection area 1701 with a length (R0) is set. On the other hand, for example in a face detection mode, a focus detection area 1702 with a length (R1) is set according to a size of a face. In this embodiment, as an example, a case where the focus detection area 1702 with the length (R1) is set will be described. Accordingly, at step S1506 of FIG. 15, the length (R1) of the focus detection area 1702 as illustrated in FIG. 17 is acquired.

Subsequently, at step S1507, the camera MPU 125 acquires a set length of a first focus detection area. The set length of the first focus detection area is a set length of a focus detection area corresponding to the first correction value. In this embodiment, as an example, a case where a correlation value for the set length in the normal mode is stored as the first correction value is described. Accordingly, at step S1507, the length (R0) of the focus detection area 1701 in FIG. 17 is acquired.

Subsequently, at step S1508, the camera MPU 125 calculates a ratio (β=R1/R0) of the set length (R1) of the focus detection area acquired at step S1506 and the set length (R0) of the first focus detection area acquired at step S1507.

Figure 16C:
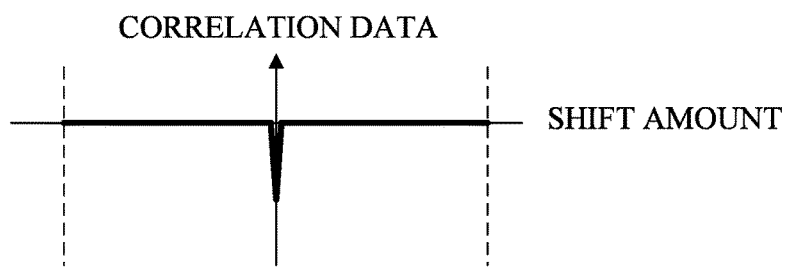
Figure 16D:
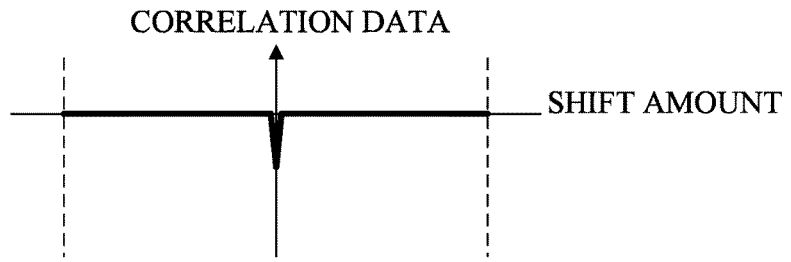

Subsequently, at step S1509, the camera MPU 125 calculates a second correction value by using the first correction value acquired at step S1502, the ratio (α) of the light receiving amounts calculated at step S1505, and the ratio (β) of the set lengths of the focus detection areas calculated at step S1508. Specifically, the camera MPU 125 calculates the second correction value based on a product of the first correction value, the ratio (α) of the first light receiving amount and the second light receiving amount, and the ratio (β) of the set length of the focus detection area and the set length of the first focus detection area (i.e., first correction value×α×β). FIG. 16C is a correlation value (i.e., first correction value×α) which is obtained by converting the correlation value for the light receiving amount Lk of FIG. 7B based on the first correction value as a correction value for the light receiving amount L0. FIG. 16D is a value (i.e., first correction value×α×β) obtained by converting the correlation value of FIG. 16C depending on the set length of the focus detection area.

Figure 16E:
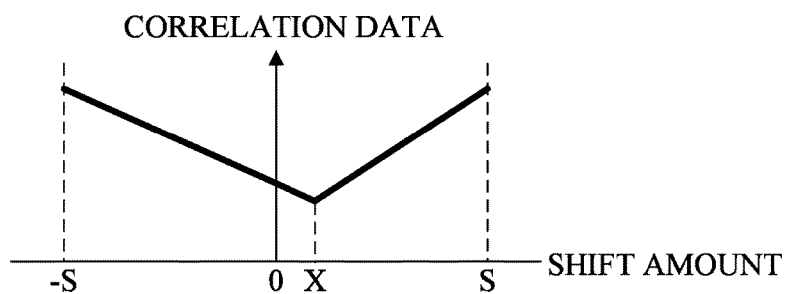

Subsequently, at step S1510 of FIG. 15, the camera MPU 125 subtracts the second correction value calculated at step S1509 from the correlation value (correlation calculation result) acquired at step S1501. Even if a plurality of minimum values appear in the correlation calculation result (correlation value or correlation data) as illustrated in FIG. 16A, a minimum value caused by the fixed pattern noise that occurs commonly in the images A and B is canceled at the shift amount of 0 as illustrated in FIG. 16E when the second correction value is subtracted from the correlation value. As described above, by subtracting the second correction value from the correlation value, the correlation calculation result (corrected correlation value or corrected correlation data) where the noise has been corrected can be obtained.

As described above, in this embodiment, the phase difference AF unit 129 (calculator 129b) calculates the correction value as the second correction value by using the first correction value, the ratio α of the light receiving amount (second light receiving amount) and the predetermined light receiving amount (first light receiving amount), and information related to the set length of the focus detection area. More preferably, the image capturing apparatus 10 includes a memory (EEPROM 125c or memory 128) that stores the set length of the first focus detection area corresponding to the first correction value. The calculator 129b calculates the second correction value based on the ratio β of the set length of the focus detection area in focus detection and the set length of the first focus detection area.

According to this embodiment, even when a correlation value caused by a fixed pattern noise occurring commonly in the images A and B, which is not relevant to a correlation value obtained from an object image, is superimposed on a correlation calculation result, the correlation value of the object image can be calculated to detect an appropriate focus position (focus state).

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

Each embodiment can reduce a variation of a correlation calculation result which is caused by a fixed pattern noise for each pixel as an in-phase noise. Accordingly, each embodiment can provide a control apparatus, an image capturing apparatus, a control method, and a non-transitory computer-readable storage medium which are capable of performing high-speed and high-accuracy focus detection.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, each embodiment can be applied also to an image capturing apparatus which performs a hybrid AF where focus detection by a phase difference detection method (i.e., phase difference AF) and focus detection by a contrast detection method (i.e., contrast AF) are combined with each other. This image capturing apparatus can selectively use the phase difference AF or the contrast AF, or alternatively it can use the phase difference AF in combination with the contrast AF.

This application claims the benefit of Japanese Patent Application No. 2016-115998, filed on Jun. 10, 2016, which is hereby incorporated by reference herein in its entirety.

What is claimed is:

1. A control apparatus comprising:
   a controller having a processor which executes instructions stored in a memory or having circuitry, the controller being configured to function as:
   an acquirer configured to acquire a first signal and a second signal that correspond to output signals of a first photoelectric converter and a second photoelectric converter, respectively, the first and second photoelectric converters receiving light beams passing through different pupil regions of an image capturing optical system; and
   a calculator configured to calculate a correlation value of the first signal and the second signal to calculate a defocus amount based on the correlation value,
   wherein the calculator is configured to correct the correlation value based on a light receiving amount of at least one of the first photoelectric converter and the second photoelectric converter, a first correction value corresponding to a predetermined light receiving amount, and a ratio of the light receiving amount and the predetermined light receiving amount.

2. The control apparatus according to claim 1, wherein the calculator is configured to:
calculate a second correction value based on the light receiving amount of at least one of the first photoelectric converter and the second photoelectric converter, and the predetermined light receiving amount, and
correct the correlation value by using the second correction value.

3. The control apparatus according to claim 2, wherein the calculator is configured to calculate the second correction value based on the ratio of the light receiving amount and the predetermined light receiving amount.

4. The control apparatus according to claim 3, wherein the calculator is configured to use the first correction value corresponding to the predetermined light receiving amount and the ratio of the light receiving amount and the predetermined light receiving amount to calculate the second correction value.

5. The control apparatus according to claim 4, wherein the first correction value is a correlation value of noises of the first photoelectric converter and the second photoelectric converter.

6. The control apparatus according to claim 4, further comprising a memory configured to store the predetermined light receiving amount of at least one of the first photoelectric converter and the second photoelectric converter, and the first correction value corresponding to the predetermined light receiving amount.

7. The control apparatus according to claim 4, wherein the calculator is configured to subtract the second correction value from the correlation value to correct the correlation value.

8. The control apparatus according to claim 1, further comprising a memory configured to store a plurality of light receiving amounts and a plurality of correction values corresponding to the respective light receiving amounts,
wherein the calculator is configured to:
search one light receiving amount which is closest to the light receiving amount of at least one of the first photoelectric converter and the second photoelectric converter from the plurality of light receiving amounts, and
select a correction value corresponding to the one light receiving amount from the plurality of correction values.

9. The control apparatus according to claim 4, wherein the calculator is configured to use the first correction value, the ratio of the light receiving amount and the predetermined light receiving amount, and a third correction value to calculate as the second correction value.

10. The control apparatus according to claim 9,
wherein the acquirer is configured to:
acquire the first signal from the first photoelectric converter,
acquire the second signal by subtracting the first signal from a combined signal of the first photoelectric converter and the second photoelectric converter, and
wherein the third correction value corresponds to a correlation value of a noise occurring due to acquisition of the second signal.

11. The control apparatus according to claim 9, further comprising a memory configured to store the predetermined light receiving amount of at least one of the first photoelectric converter and the second photoelectric converter, the first correction value corresponding to the predetermined light receiving amount, and the third correction value.

12. The control apparatus according to claim 4, wherein the calculator is configured to calculate the second correction value by using the first correction value, the ratio of the light receiving amount and the predetermined light receiving amount, and information related to a set length of a focus detection area.

13. The control apparatus according to claim 12, further comprising a memory configured to store a set length of a first focus detection area corresponding to the first correction value,
wherein the calculator is configured to calculate the second correction value based on a ratio of a set length of the focus detection area in focus detection and the set length of the first focus detection area.

14. An image capturing apparatus comprising:
an image sensor including a first photoelectric converter and a second photoelectric converter that receive light beams passing through different pupil regions of an image capturing optical system; and
a controller having a processor which executes instructions stored in a memory or having circuitry, the controller being configured to function as:
an acquirer configured to acquire a first signal and a second signal that correspond to output signals of the first photoelectric converter and the second photoelectric converter, respectively; and
a calculator configured to calculate a correlation value of the first signal and the second signal to calculate a defocus amount based on the correlation value,
wherein the calculator is configured to correct the correlation value based on a light receiving amount of at least one of the first photoelectric converter or the second photoelectric converter, a correction value corresponding to a predetermined light receiving amount, and a ratio of the light receiving amount and the predetermined light receiving amount.

15. The image capturing apparatus according to claim 14, wherein the image sensor includes the first photoelectric converter and the second photoelectric converter for one of plural microlenses, and the plural microlenses are arrayed in two dimensions.

16. A control method comprising the steps of:
acquiring a first signal and a second signal that correspond to output signals of a first photoelectric converter and a second photoelectric converter, respectively, the first and second photoelectric converters receiving light beams passing through different pupil regions of an image capturing optical system; and
calculating a correlation value of the first signal and the second signal to calculate a defocus amount based on the correlation value,
wherein the step of calculating the defocus amount includes the steps of:
correcting the correlation value based on a light receiving amount of at least one of the first photoelectric converter and the second photoelectric converter, a correction value corresponding to a predetermined light receiving amount, and a ratio of the light receiving amount and the predetermined light receiving amount, and
calculating the defocus amount based on the corrected correlation value.

* * * * *